United States Patent [19]

Nishino et al.

[11] Patent Number: 5,030,319

[45] Date of Patent: Jul. 9, 1991

[54] METHOD OF OXIDE ETCHING WITH CONDENSED PLASMA REACTION PRODUCT

[75] Inventors: Hirotaka Nishino; Nobuo Hayasaka, both of Yokohama; Haruo Okano, Tokyo, all of Japan

[73] Assignee: Kabushiki Kaisha Toshiba, Kawasaki, Japan

[21] Appl. No.: 457,946

[22] Filed: Dec. 27, 1989

[30] Foreign Application Priority Data

Dec. 27, 1988 [JP] Japan ................... 63-327594

[51] Int. Cl.$^5$ ......................................... H01L 21/306
[52] U.S. Cl. ..................... 156/635; 156/643; 156/646; 134/1; 134/31
[58] Field of Search ............... 156/635, 642, 643, 646; 134/1, 30, 31

[56] References Cited

U.S. PATENT DOCUMENTS

| | | | |
|---|---|---|---|
| 3,485,687 | 12/1969 | Chapman et al. | 156/635 |
| 3,494,768 | 2/1970 | Schaefer | 156/635 |
| 3,520,684 | 7/1970 | Metlay et al. | 156/635 |
| 4,127,437 | 11/1978 | Bersin et al. | 156/635 |
| 4,473,435 | 9/1984 | Zafiropoulo et al. | 156/643 |
| 4,518,456 | 5/1985 | Bjorkholm | 156/635 |
| 4,615,756 | 10/1986 | Tsujii et al. | 156/635 |
| 4,643,799 | 2/1987 | Tsujii et al. | 156/635 |
| 4,740,267 | 4/1988 | Knauer et al. | 156/635 |
| 4,807,016 | 2/1989 | Douglas et al. | 156/646 |
| 4,816,098 | 3/1989 | Davis et al. | 156/643 |

FOREIGN PATENT DOCUMENTS

| | | |
|---|---|---|
| 54-54578 | 4/1979 | Japan . |
| 56-29672 | 3/1981 | Japan ................... 156/635 |
| 0125422 | 1/1989 | Japan . |
| 8907335 | 8/1989 | PCT Int'l Appl. ............... 156/635 |

Primary Examiner—Richard V. Fisher
Assistant Examiner—John J. Bruckner
Attorney, Agent, or Firm—Foley & Lardner

[57] ABSTRACT

Oxide material, on a substrate, in a reactor, is etched by dissolving a hydrogen halide reaction product in a liquid phase reaction product. Both the hydrogen halide and liquid phase reaction products are produced through a chemical reaction of a reactive gas containing hydrogen and halogen elements as well as at least one gaseous compound which has been remotely activated. The liquid phase reaction product is obtained by condensation on the oxide material. The use of charged particle beams and irradiating light is discussed.

6 Claims, 19 Drawing Sheets

METHOD OF OXIDE ETCHING WITH CONDENSED PLASMA REACTION PRODUCT

BACKGROUND OF THE INVENTION

1. Field of the Invention

The present invention relates to a surface processing technique of a substate which is processed to fabricate a semiconductor device. Particularly, this invention relates to a surface processing technique for removing or dry etching of an oxide film formed on said substrate.

2. Description of the Prior Art

It has been found that a native oxide film formed on the surface of a semiconductor substrate such as silicon, and on a semiconductor or metal film formed on said substrate, causes a problem in the fabrication of a semiconductor device from that substrate. This film is formed easily by exposing the substrate to the air, or delivering the substrate between fabrication apparatus. This film is usually very thin (for example, the film thickness of silicon native oxide is about 5–20Å-that is, oxide having 2–3 atomic layers), but this causes difficulties in the fabrication processes and affects the electrical properties of semiconductor devices.

For example, it is significant in case that a layer of one material formed on a semiconductor substrate is etched selectively, leaving layers of other materials, such as Si selective etching to silicon dioxide. It is also significant in a selective CVD process or the like in which a film should be deposited selectively on a particular part of a substrate, surface such as contact holes or through holes.

The selective etching and the selective CVD process mentioned above may be done utilizing the differences in properties between materials. Consider a case in which semiconductor materials such as silicon; metals such as aluminum; and their nitrides are etched by electrically neutral atoms or molecules. In this case, aluminum and silicon can be etched by chlorine gas, and silicon nitride can be etched by a interhalogen gas such as clF; but the oxides cannot be etched by these gases at all. A selective etching is therefore possible between these materials.

When a native oxide film is formed on the surface of a semiconductor or a metal, however, the selectivity between these materials is lost somewhat, whereby poor etching is caused.

Recently, a new method for better selective etching has been developed. In this method, a reactive ion etching apparatus equipped with means of making a magnetron plasma and cooling the substrate is used. Consider a case in which a silicon substrate is to be etched by chlorine gas, leaving a silicon dioxide film using the method mentioned above. $SiCl_4$ is produced as a silicon etching product and $SiCl_x$ (x=1–3) is produced from the X decomposition of $SiCl_4$ in the magnetron plasma. These solar materials are easily adsorbed on a silicon dioxide surface which has polarity and as a result, an adsorbed layer is formed. The surface of the silicon dioxide cannot be etched, because the adsorption layer prevents etching. On the other hand, a silicon substrate can be etched, because it has no polarity and an adsorption layer to prevent etching is not formed. As a result, selective etching can be successfully carried out in this case. The etching selectivity becomes worse, however, when a native oxide film is formed on a silicon substrate surface.

In a case of selective CVD using $WF_6$, $H_2$ and silane gases or the like, tungsten is deposited on a silicon or metal surface of the substrate by a reaction between said surface materials and said gases if the substrate is kept at a suitable temperature. On the other hand, tungsten cannot be deposited on a surface covered with oxides of said substrate materials, because said gases cannot react with these oxides. Thus, a selective CVD is executed between silicon, metal and their oxides. In this case, the etching selectivity is reduced, and so an efficient selective CVD cannot be performed if the silicon or metal is covered with a natitive oxide film.

In cases of molding wires and electrode materials into contact holes or through holes, the resistivity of these holes increases when the substrate is covered with a native oxide film. As a result, the operating speed of devices made of this substrate decreases.

The deterioration of etching selectivity mentioned above is particularly significant in processes in which a chemical reaction is dominant. It is also significant in processes such as the reactive ion etching process, in which a physical interaction caused by an irradiation of energetic ions is added to the chemical reaction.

As mentioned above, good selectivity for etching or deposition cannot be obtained when a surface to be processed is covered with native oxides. Currently no treatments for removing the native oxides have been successfully developed. With the scaling down of electronic devices, however, it is highly desired to obtain a reliable technique for removing the native oxides easily, in order to carry out good selective etching or deposition.

The native oxide formed on a substrate causes problems not only in etching and CVD but also in the processes of oxidation, epitaxial growth and diffusion.

In a formation of an oxide film (especially gating oxide film), it is highly desirable that the film formed should have a high quality, and uniform thickness. However, if a native oxide film exists on a substrate before the formation of said oxide film by high temperature oxidation, new oxide film grows up over the poor quality native oxide film, which is formed at room temperature. The quality of the gating oxide is lowered, as a result. Furthermore, the thickness of the gating oxide becomes nonuniform, because the thickness of the native oxide formed before the formation of said gating oxide is not uniform, and has no reproducibility in thickness.

In an epitaxial growth on a silicon substrate, the surface of the substrate should be very clean and native oxide must be removed in order to obtain a silicon epitaxial film of good quality. In an actual process, a substrate surface having native oxide is first treated by wet cleaning to remove organic and metal contaminants or the like from the surface of the substrate. Then, the substrate is placed in a vacuum chamber for epitaxial growth. HCl or $H_2$ gas is then introduced into the chamber, and the substrate is heated in order to change the native oxides into SiO. The SiO film is removed easily by sublimation from the heated substrate. Contaminants on walls of the chamber break away from the walls, however, and adhere to the substrate during said heating process.

In the vapor or solid state diffusion process of B, As and P into a silicon substrate, the diffusion efficiency may also be reduced if a native oxide is formed on the substrate because it becomes a diffusion barrier.

Other than the native oxides mentioned above, it is also necessary to remove or etch an oxide film formed by the process of fabricating a semiconductor device.

In a DRAM fabrication process, a technique is used in the formation of a so-called trench capacitor. In this technique, a capacitor is made on an inner surface of a trench formed in a silicon substrate in order that it occupies a small area without decreasing the capacity of this area. But if the corners of the trench is steep, the electric field of the gating oxide at the corners becomes very high, and dielectric breakdown can be easily occurred. To avoid this, the substrate should be processed as follows. First, the substrate having trench is oxidized at a high temperature above 900° C., so as to form a uniform oxide film on the trench. This oxidation process is called 'sacrificing oxidation'. Removing this oxide film, a trench with rounded corners and smoothed surface is gained. Then, a gating oxide film is formed on the trench surface of the substrate. The corners of the trench is rounded, so that the insulation breakdown can be avoided.

In this process, the removal of said oxide film should be done without damaging the silicon substrate, and it should only be selectively removed from the substrate.

Furthermore, the substrate having trench may follow CVD process to deposit impurity-containing silicon dioxide on the trench surface, to form electrodes inside the trench. The impurities in the deposited oxide film will be diffused into the silicon substrate by heating. After this diffusion, the silicon dioxide film should be removed selectively, without damaging the underlying substrate.

When forming contact holes or through holes by etching a part of the silicon dioxide film formed on the silicon or wire, the etching should be carried out without damaging the underlying materials. Such damage increase the contact resistivity of these holes.

If the substrate is repeatedly processed in a reaction chamber, silicon dioxide or the like sometimes adheres to the back surface of the substrate and the surface of the chamber walls. This occurs, for example, when a deposition gas containing silicon or the like is introduced into a reaction chamber. In this case, the oxides adhering to the chamber wall peel off and deposit on the substrate so as to lower the yield of devices made of the substrate. It is highly desirable, therefore, that the oxide deposited on the substrate be easily removed before it is subjected to the next process.

Furthermore, the oxide film mentioned above sometimes contains alkaline metals or heavy metal and should be removed from the substrate. Usually the removal of said film from a substrate is done by wet etching, using hydrofluoric acid or a hydrofluoric acid/ammonium fluoride buffer solution. In this method, the oxide can be selectively removed from the silicon substrate, without damaging the underlying substrate.

The oxide formed inside a trench which has a high aspect ratio (trench depth vs. apparture radius of the trench), however, cannot be easily removed by the above mentioned wet etching method, because surface tension makes it difficult for an etchant to enter the trench. Furthermore, wet etching produces silicates on substrates as a result of the etching reaction. These silicates should be completely removed by a rinse using pure water. If the rinsing is not done through, however, the silicates remain on the substrate surface to form colloid and spots on the surface. It is also not easy to deal with hydrofluoric acid and hydrofluoric acid/ammonium buffer solution because they have strong toxicity. Furthermore, a native oxide film will again be formed on the substrate when it is exposed to the air after the wet etching.

To solve the problem of using the wet etching mentioned above, a dry etching method has been proposed, which uses gas to remove the oxides. Oxides of silicon or the like can be dry-etched by fluorine atoms for example.

Fluorine atoms etch silicon and metal substrates along with silicon dioxides, however, therefore selective etching of silicone dioxide alone cannot be achieved by this method.

SUMMARY OF THE INVENTION

It is therefore an object of this invention to provide a surface processing apparatus and a method by which a native oxide or other oxide film formed on a substrate to be processed can be efficiently dry-etched in the fabrication process of semiconductor devices.

It is another object of this invention to provide a surface processing apparatus by which only an oxide film formed on a substrate can be selectively dry-etched without damaging the underlying substrate before this substrate is subjected to a process such as an etching, deposition, oxidation, diffusion, epitaxial growth, etc..

One aspect of this invention provides a surface processing apparatus to dry-etch an oxide film formed on the substrate to be processed. The apparatus is comprised of a reaction chamber and a means for introducing gases into said chamber and a means for activating at least one component gas of said introducing gases. The reaction chamber holds said substrate within, and can be made to provide a vacuum. Gases to be introduced into said reaction chamber must contain either a gas containing halogen element (described as a 'halogen-containing gas' hereinafter) and a basic gas. According to the aspect of this invention, a halogen-containing gas and a basic gas, which are introduced into said reaction chamber by said gas introducing means, and both or either of which are activated by said activating means, react with each other in the chamber or in a different place from said chamber connected to that place to form haloid products. The haloid products react with the oxide film to be removed, to form products which can be easily sublimated. Only the oxide film can therefore be etched selectively without damaging the underlying substrate.

Another aspect of this invention also provides a surface processing apparatus to dry-etch on oxide film formed on the substrate to be processed. The apparatus is comprised of a reaction chamber and a means for introducing gases containing a haloid gas into said reaction chamber. In this case, directly introduced haloid gas reacts with the oxide film to be removed, to form products. In these apparatus, more efficient etching of said oxide film can be accomplished by cooling said substrate when the gases are introduced, and by providing means for heating said substrate when the gases are exhausted. Furthermore, an window can be provided on a reaction chamber so as to transmit radiation beams or charged particle beams through the window. In these apparatus, the portion of the substrate surface or out of the substrate surface exposed by said beam will be etched selectively. The means of activating the above mentioned gases can be electric discharge, light radiation, heating, charged particle radiation or using active species which are electrically neutral. The active species will react with said gases, and activate them.

Another aspect of this invention provides a surface processing apparatus for dry-etching an oxide film formed on a substrate, which was or will be subjected to a fabrication process such as an etching, deposition, oxidation, diffusion, epitaxial growth, etc. before or after said dry-etching. This apparatus is comprised of a reaction chamber which can be evacuated to a vacuum, and which holds said substrate. The apparatus also provides either of following a) or b) means: a) a means for introducing gases into said chamber, which contain a halogen-containing gas and a basic gas, and a means for activating at least one of the said halogen-containing gas or the basic gas, or b) a means for introducing a haloid gas into said chamber, and as well as a means to introduce process gases for etching, deposition, oxidation, diffusion, epitaxial growth etc. into said reaction chamber.

According to the third aspect of this invention, a useless oxide film formed on a substrate can be dry etched by said gases introduced into the reaction chamber before the substrate is subjected to a fabrication process such as etching, deposition, oxidation, diffusion, epitaxial growth etc.. Therefore, the fabrication process such as etching can be done on the clean surface of the substrate etched by said gases. As a result, the accuracy of said fabrication processes can be improved greatly. Furthermore, the oxide film formed on the substrate after said fabrication processes can be removed without damaging the substrate. Excellent result can thus be obtained by using this apparatus. In this time, more efficient etching of said oxide film can be accomplished by cooling said substrate when the gases are introduced and by heating said substrate after the gases are exhausted.

The fourth aspect of this invention provides a method of surface processing the substrate's oxide film for dry-etching. The steps are as follows:

placing said substrate having said oxide film in the reaction chamber; and then introducing a halogen-containing gas and a basic gas into the reaction chamber and then activating at least one of the said halogen-containing gas and a basic gas.

The fifth aspect of this invention provides a method of surface processing the substrate's oxide film for dry-etching. The steps are first, placing said substrate having said oxide film in the reaction chamber; and then introducing a haloid gas into said chamber.

Both in the fourth and fifth aspects of this invention involve a haloid.

In the fourth aspect of this invention, the halogen-containing gas and the basic gas react to produce haloid products. The products in the fourth aspect or the haloid gas in the fifth aspect react with the oxide film to be removed; forming products which can be easily sublimated. The oxide film formed on the substrate can therefore be removed by evaporating said products, without damaging the substrate. The evaporating process can be accomplished by activating the substrate such as heating and beam radiation. The haloid is formed thick as the substrate's temperature becomes lower, to allow rapid etching. The substrate must therefore be cooled to a suitable temperature at the gas introduction. When a particular area of the substrate is selectively radiated by a beam, the gases above this area will be efficiently activated, or the temperature of the are will be high. Good selective etching can be done to said area of the substrate, as a result.

The sixth aspect of this invention provides a method of surface processing the substrate's oxide film for gas-etching. First, a substrate having an oxide film on its surface is placed in a reaction chamber. Next, gases are introduced into said reaction chamber through at least one gas inlet.

During the gas introduction, at least one component of said gases is activated in a different place from said chamber, which is connected to that place. Said gases are comprised of either pure gases or mixture gases containing hydrogen element, halogen element and either of: a) all component elements of any gases which form liquids by reacting with hydrogen halide gases made from said halogen element and hydrogen element or: b) all component elements of any gases which form liquids that dissolve hydrogen halides made from said halogen element and hydrogen element.

According to the seventh aspect of this invention, liquids containing hydrogen halides are formed on the surface of the sample. The oxide film on the sample are etched away by the reaction between said liquids and said oxide film, without damaging the substrate. During this process the substrate's temperature must be kept low, to allow easy formation of said liquids. The pressure of the reaction chamber must also be kept high, to allow efficient etching. If the oxide film is etched in part by charged particle beams or the like in advance, the etching of this invention can be carried out in a short time, without damaging the substrate.

The eighth aspect of this invention provides a surface processing apparatus for dry-etching an oxide film formed on a substrate. This apparatus is comprised of a reaction chamber in which said substrate is placed, means for introducing gases into said reaction chamber, and means for activating at least one of said gases in a different place from said chamber, which is connected to that place. The gases contain hydrogen element, halogen elements and either of: a) all component elements of any gases which form liquids by reacting with hydrogen halide gases made from said halogen elements and hydrogen element or: b) all component elements of any liquids which dissolve said hydrogen halide gases.

According to this aspect, liquids containing hydrogen halides, are formed on the substrate's surface. The oxides formed on the substrate are etched away by the reaction between said liquids and said oxides, without damaging the substrate. If the substrate's temperature is kept sufficiently low during the process, a large amount of said liquids are formed to allow efficient etching. There may be residual halogen on the substrate's surface after the etching, however, this is removed from the surface by introducing activated hydrogen gas into the chamber, or radiating light on the surface.

The ninth aspect of this invention provides a surface processing apparatus according to the seventh aspect, which is further comprised of a means for a fabrication process such as an etching, deposition, oxidation, diffusion, epitaxial growth etc.. The removal of an oxide film according to this aspect may be carried out in the same chamber where said fabrication processes are carried out, or in a different place from said chamber.

According to this aspect, processes such as an etching, deposition, oxidation, diffusion, epitaxial growth etc. can be carried out on a substrate's surface having no native oxide film. As a result, an efficient process is carried out to the substrate, and excellent electric properties are obtained in devices made from the substrate. Furthermore, useless oxide films formed during said fabrication processes can be removed efficiently by using the apparatus according to this aspect.

These and other objects, features and advantages of the present invention will be more apparent from the following description of preferred embodiments, taken in conjunction with the accompanying drawings.

DETAILED DESCRIPTION OF THE EMBODIMENTS

Embodiment 1

Figure 1:
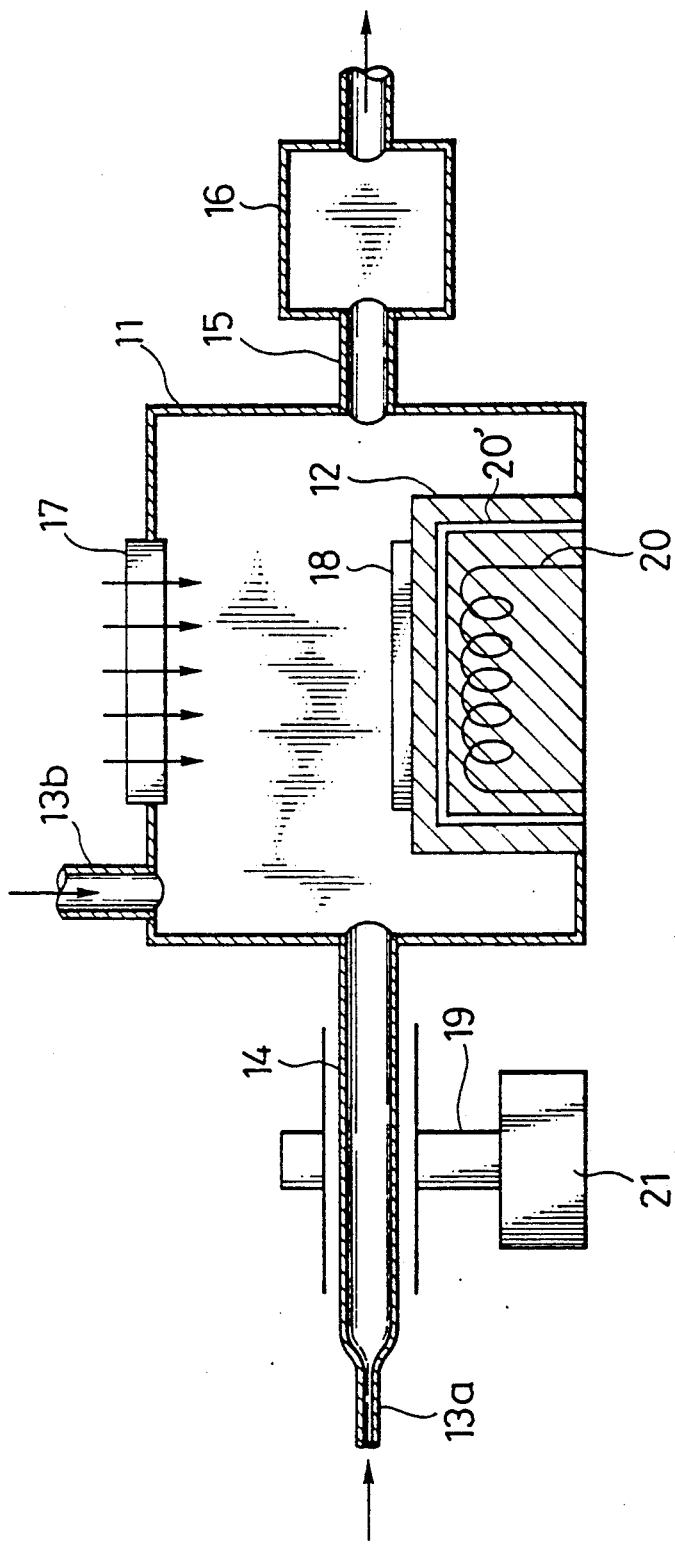
FIG. 1 is a schematic view showing a surface processing apparatus, according to an embodiment of this invention.

FIG. 1 shows a schematic view of a surface processing apparatus embodying the invention. The main part of this apparatus is comprised of a vacuum chamber 11, a sample table 12 which supports and places a sample 18 in the chamber 11, gas inlets 13a and 13b, a quartz discharging tube 14 to discharge a gas introduced from the inlet 13a, a gas exhausting port 15 to exhaust waste gases from the chamber and a waste gas treatment device 16 to remove a toxic component from the waste gas. In addition, chamber 11 is provided with a quartz window through which a light is radiated to the sample 18, and with a means (not shown) for heating both the chamber 11 and the discharging tube 14. The walls of the chamber 11 and the discharging tube 14 must be maintained above 100° C. by said heating means; otherwise a thin film formed on the surface of sample 18 by the treatment according to this invention will be formed on the walls. The sample table 12 has a means for mechanically fixing the substrate 18, and a means 20 for maintaining the temperature of the sample table 12 at a fixed temperature, between −10° C. and +200° C., namely a heating means 20 and a cooling means 20' for cooling the sample by introducing coolant. A microwave at 2.45 GHz from a microwave supply 21 is applied to the discharging tube 14, through a wave guide 19. As a result, a nonpolor discharge is generated inside the tube; and the gases introduced through the inlet 13a are decomposed. Instead of the window 17, an electron gun can be installed to emit electron beams onto the sample surface.

Figure 2:
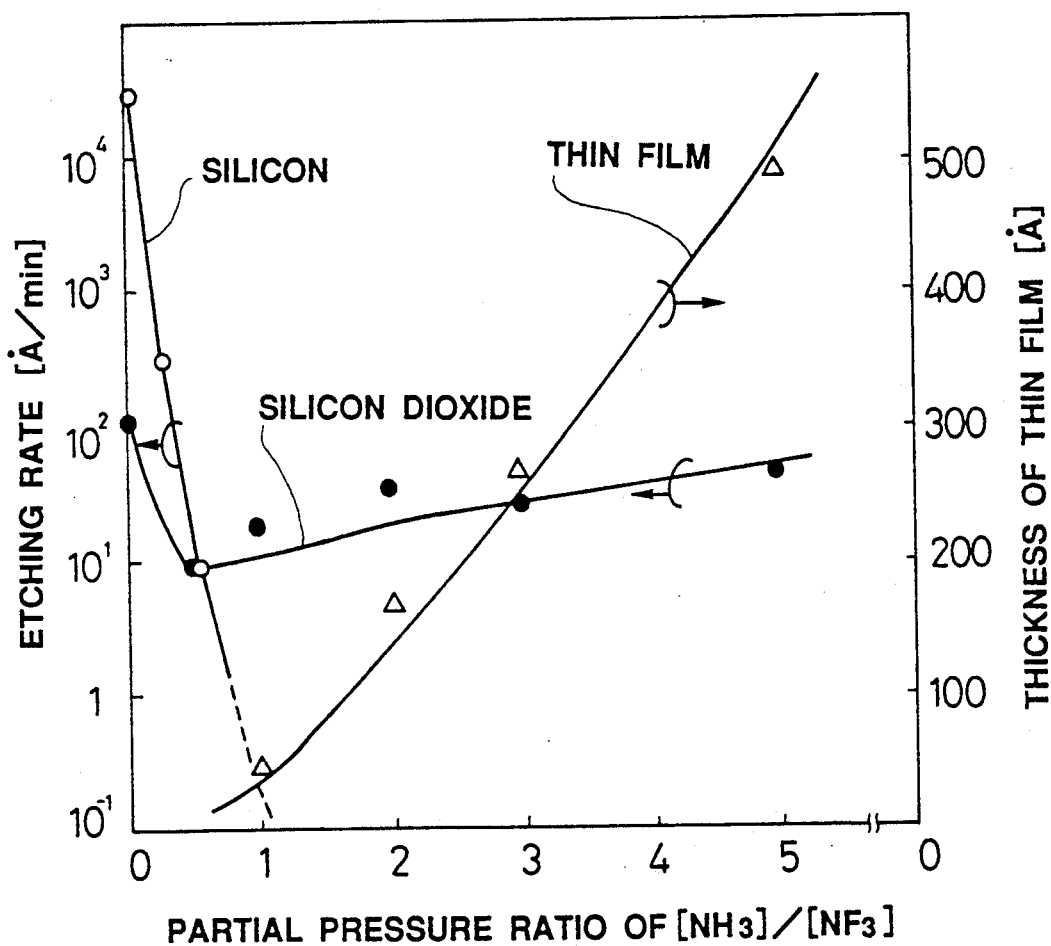
FIG. 2 is a graph showing the relation between the partial pressure of gases and the etching rate.

An etching method for silicon dioxide film will be explained by using the apparatus shown in FIG. 1. The graph shown in FIG. 2 illustrates the relation between the etching rate and the partial pressure rate of $NF_3$ as a halogen-containing gas and $NH_3$ as a basic gas. These gases are introduced from the gas inlet 13a. The measurement was carried out while changing the mixture rate of these gases under a fixed pressure (0.3 torr) in the chamber 11. The temperature of the sample 18 was about 25° C., and the discharging time was 10 minutes.

From this graph it is understood that silicon and silicon dioxide both can be etched if the amount of $NH_3$ in the mixture gas is small—that is, the partial pressure rate of $NH_3$ is less than 1. In this case, the etching rate decreases as the partial pressure of $NH_3$ increases. A thin film is formed on the surface of the substrate 18 when the partial pressure of $NH_3$ gas becomes greater than that of $NF_3$ gas As shown in FIG. 2, the thickness of the thin film increases as the partial pressure of $NH_3$ gas increases. This thin film is removed easily by heating it above its sublimation temperature-that is, over 100° C. It is also understood from the graph that if the partial pressure rate is over 1, silicon cannot be etched at all. On the other hand, the etching rate of silicon dioxide increases with the increase of the $NH_3$ partial pressure rate. As a result, silicon dioxide can be etched selectively with respect to other materials, such as silicon. When the sample was heated over 100° C., the thin film was not formed on the surface, even when the partial pressure of $NH_3$ was high enough.

Besides heating, the thin film mentioned above can be removed by solving it into water or organic solvents. The component of the thin film was found by X-ray photoelectron spectroscopy to include F and N elements and by IR analysis to include $NH_4+$ and $SiF_6^{2-}$ ions. Therefore, it is understood that the thin film contains $NH_4F$ which is a compound made from a halogen-containing gas, a basic gas, and $(NH_4)_2SiF_6$ which is a compound made from these gases and a component of the substrate, that is, silicon. The $NH_4F$ seems to be formed as follows. First, an F atom is produced from $NF_3$ by electric discharge. The F atom reacts with $NH_3$ to form HF; then the HF is combined with $NH_3$ to form $NH_4F$.

The etching mechanism mentioned above is thought to be as follows. The charge distribution of a $NH_4F$ molecule is not uniform. The F atom which has high electronegativity has a negative charge; and the $NH_4$ has a positive charge. Likewise, in $SiO_2$, the O atom which has high electro-negativity has a negative charge; and the Si atom has a positive charge. Therefore, when $NH_4F$ moves on toward $SiO_2$, the F atom is attracted to the Si atom, while the $NH_4$ is attracted to the O atom due to Coulomb's force. As a result, the $NH_4F$ is decomposed, and reacts with $SiO_2$ to form $SiF_4$ and $H_2O$. The $H_2O$ is removed by vaporization from the substrate; while the $SiF_4$ is combined with $NH_4F$ to form $(NH_4)_2SiF_6$, and is taken into the thin film.

When $(NH_4)_2SiF_6$ is heated, it is decomposed into $SiF_4$, $NH_3$ and HF. These products are volatilized easily by heating, and removed from the substrate. The mechanism of the entire reaction explained above can be written as follows.

$$F + NH_3 \longrightarrow HF + NH_2$$

$$HF + NH_3 \longrightarrow NH_4F$$

$$6NH_4F + SiO_2 \longrightarrow (NH_4)_2SiF_6 + H_2O$$

$$(NH_4)_2SiF_6 \longrightarrow NH_3 + HF + SiF_4$$

Metal oxide can be removed by almost the same mechanism mentioned above. For example, alumina ($Al_2O_3$) can be etched by $NH_4Cl$, which is produced from a halogen containing gas and a basic gas. The mechanism is as follows.

$$Al_2O_3 + 8NH_4Cl \rightarrow 2NH_4AlCl_4 + 3H_2O \uparrow + 6NH_3 \uparrow$$

$$NH_4AlCl_4 \rightarrow AlCl_3 \uparrow + NH_3 \uparrow + HCl \uparrow$$

In the embodiment mentioned above, $NF_3$ gas is used as a halogen-containing gas; and $NH_3$ gas is used as a basic gas. However, it is possible to use other combinations of halogen containing gas and basic gas. Light emission, heating, emission of charged particle beams, or a reaction with active species can also be used as an activation alternatives to the discharging means mentioned above.

A halogen containing gas may be activated to produce active species containing halogen atoms. In this case, these active species may be reacted with a basic gas to remove silicon dioxide or metal oxide; or a gas which will decomposed itself spontaneously to produce active species containing halogen atoms may be used as a halogen gas. In this case, the active species produced spontaneously may be reacted with a basic gas to remove silicon dioxide or metal oxide and it is not necessary to activate gas. Alternatively, a basic gas may be activated and reacted with a halogen-containing gas, in order to remove silicon dioxide or metal oxide.

Instead of producing a vapor reaction in the vacuum chamber as mentioned above, it is also possible to introduce haloid gas, a gaseous mixture of haloid vapor and $H_2O$ vapor, or a vapor of haloid aqueous solution into the chamber to remove or etch silicon dioxide and metal oxide.

Figure 15:
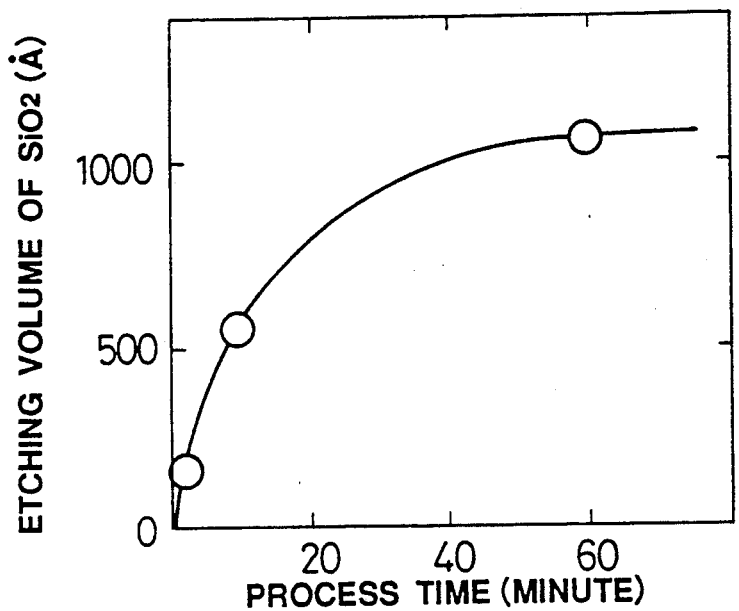
FIG. 15 is a graph showing the relation between the treatment time and the etching rate.
Figure 16:
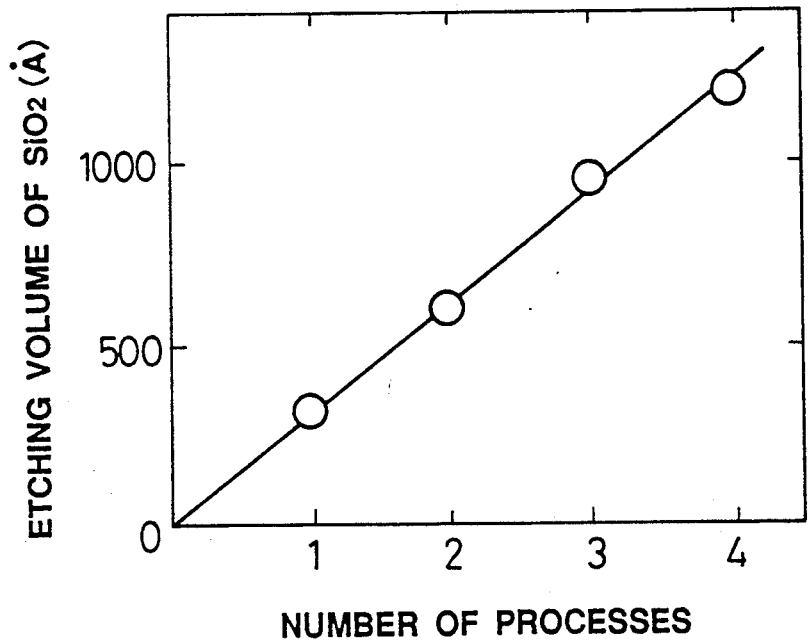
FIG. 16 is a graph showing the relation between the number of treatments and the etching rate.

The thin film mentioned above thickens as the treatment time increases. While the volume of the etching does not increase in proportion to the treatment time as shown in FIG. 15, it is understood from FIG. 15 that the etching volume will become saturated gradually as the treatment time becomes longer; and the etching rate will decrease. It is thought that products produced by the etching reaction can not be broken away from the substrate when the thin film becomes thick, and etching is suppressed. Therefore, an efficient etching can be done by repeating the formation process of the thin film and the removal process alternately instead of simply extending the treatment time. As a matter of fact, silicon dioxide was etched in proportion to the number of times the treatment (as shown in FIG. 16) was repeated, alternating the formation process of the thin film and the removal process. The measurement was done using the apparatus shown in FIG. 1. The formation of the thin film was done using a gas mixture of $NF_3$ and $NH_3$ (0.05 Torr. for $NF_3$, 0.25 Torr. for $NH_3$), discharged for 10 minutes. The removal of the thin film was accomplished by heating the substrate at 120° C., in a vacuum.

An efficient etching is obtained when the substrate is cooled to a certain degree of temperature. Consider the case in which the mixture of $NF_3$ gas of 0.05 torr and $NH_3$ gas of 0.25 torr are discharged using the apparatus shown in FIG. 1, as an example. In this case, the etching rate was several tens of Å per minute when the substrate is kept at room temperature. On the other hand, the etching rate was more than 100 Å per minute when the substrate is cooled to 5° C. This improvement in etching rate is thought to be due to the ease of $NH_3F$ thin film formation in a low temperature range.

There is another method to improve etching efficiency; using a fluorine-containing gas and a hydrogen containing gas. These gases are discharged in order to react with each other, and the gas generated by the discharge process is introduced into a vacuum chamber after the formation of a thin film. For example, when a gas mixture of $NH_3$ and $NF_3$ having a partial pressure rate of $NH_3/NF_3 = 5$ was discharged for 10 minutes to form a thin film, silicon dioxide was etched by about 300Å. In the next step, $H_2$ and $NF_3$ gases having a partial pressure ratio ($H_2/NF_3$) of 10 were introduced into the chamber and discharged for about 5 minutes, without removing the thin film formed in the preceding step. As a result, $SiO_2$ was etched by about 600Å. The reason of this efficient etching is thought to be that the HF gas produced by the discharge of $NF_3$ and $H_2$ gases etched $SiO_2$ through the thin film. On the other hand, an etching did not occur with the discharge of those gases when a thin film was not formed on a substrate. It is therefore thought that the thin film has the property to increase the density of HF near a substrate surface so that the reaction between a gases and $SiO_2$ happens frequently.

Figure 17:
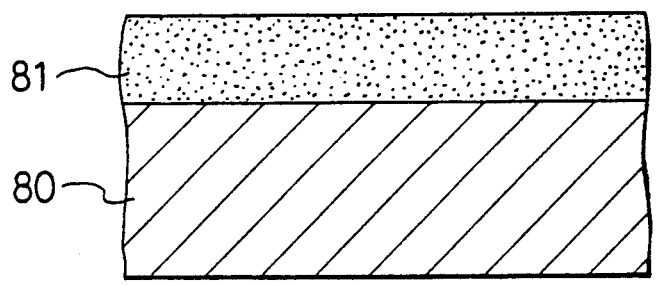
FIGS. 17a and 17b are cross-sectional views of a substrate, showing steps of a method according to one embodiment of this invention.
Figure 17:
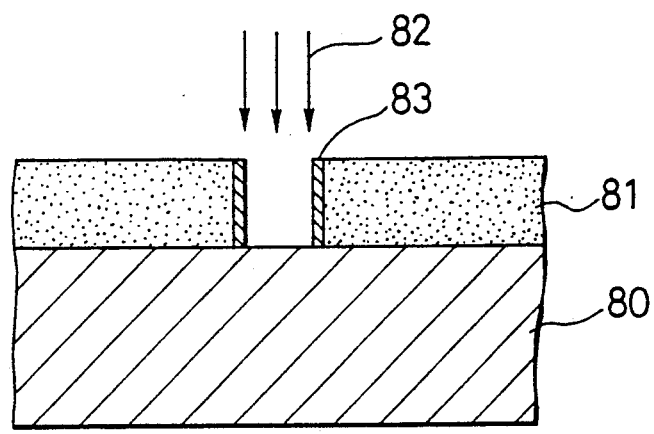

As explained above, an etching for a particular area and an etching for a particular direction may be possible if the thin film is formed and removed on the particular area or direction of a substrate. For instance, a sample having a silicon dioxide film 81 on its surface as shown in FIG. 17a is placed on the sample table 12 of the vacuum chamber 11 shown in FIG. 1. $NF_3/NH_3$ gases ($[NF_3]/[NH_3] = 1/5$) then are introduced into the chamber 11 without applying a discharge to the gases through the gas inlet 13b. During the process, the sample table temperature is maintained at 10° C. As the gases are introduced, a particular area of the sample surface is radiated with ArF laser light (193 nm wavelength) through the window 17. As a result, silicon dioxide on the area radiated by the light 82 is etched only vertically as shown in FIG. 17b. The reason why only the radiated part is etched is hypothesized as follows. A reaction between $NH_3$ and the fluorine atoms produced from $NF_3$, and said between $NF_3$ and hydrogen atoms produced from $NH_3$ by light decomposition takes place only in the radiated area of the sample. The haloid used as an etching material to remove silicon dioxide can therefore be produced only in this area. The reason of the vertical etching is as follows. During the process, the sample temperature is maintained at 10° C. Only a thin film 83 forms on the side walls of the etching hole, so that the silicon dioxide on the side walls can hardly be etched; Whereas the bottom surface of the etching hole is always radiated, and both the formation and the removal of the thin film occurs there to cause an efficient etching.

Contrary to the facts mentioned above, it is possible to surpress the etching by emitting light, charged particle beams, or neutral particle beams on a particular area of the sample surface so as to activate that area. By activating this area of the sample, the formation of the thin film is suppressed so that etching can not be done in this area.

Most of the basic gases are corrosive, toxic, and explosive. It is not therefore necessary in this invention to introduce a basic gas directly into the chamber. Instead, gases which contain components of a basic gas can be introduced into a chamber. These gases should be activated inside or outside of the chamber; and be made to react with each other so as to form a basic gas. For example, $N_2$ and $H_2$ gases which are relatively safe can be used, instead of $NH_3$ gas. The mixture of these gases should be discharged to produce $NH_3$.

Moreover, a haloid such as $NH_4F$ which can be decomposed easily in its gaseous state can be supplied to a sample in the form of a $NH_3F$ cluster which is made by condensation through adiabatic expansion of a gas containing $NH_3$ and $HF$.

Embodiment 2

Figure 3:
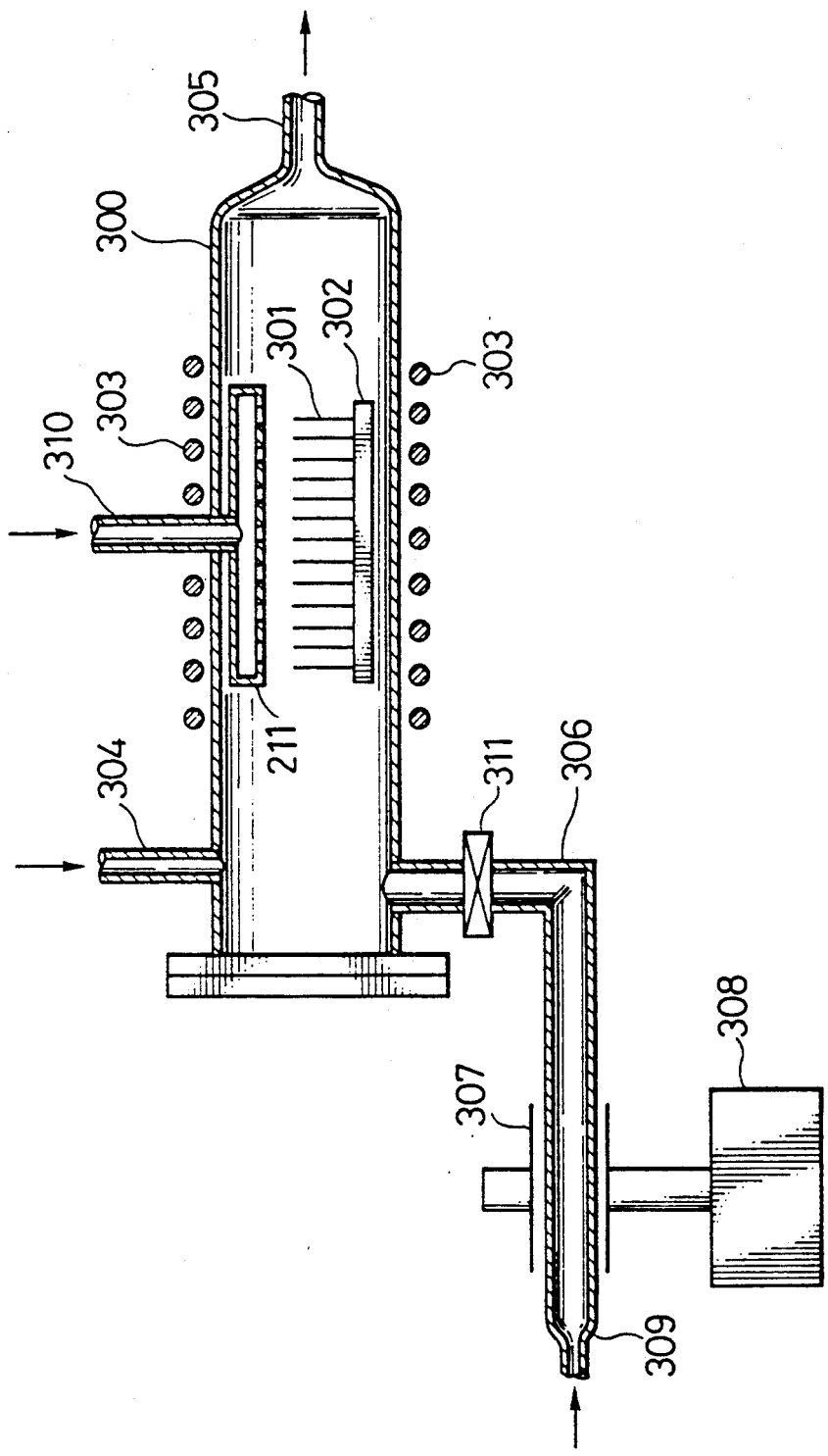
FIGS. 3, 4, 9-12, and 14 are schematic views showing surface processing apparatuses, according to embodiments of this invention.

FIG. 3 shows a schematic view of a surface processing apparatus of the second embodiment of this invention. This apparatus is made up of an oxidation apparatus which is used to fabricate a semiconductor device. A means for removing or etching an oxide film on a substrate as a pretreatment is provided by the oxidation apparatus in order to make a surface processing apparatus of this embodiment. In the figure, the reference numeral 300 shows a reaction chamber where an oxidation of a substrate to be processed, that is, a silicon wafer, takes place. In the chamber 300, a plurality of substrates 301 are placed on the sample holder 302. These substrates may be placed vertically on the sample holder 302. An R.F. coil is also provided outside the reaction chamber, in order to heat the substrates 301. There is a gas inlet 304 to the chamber to introduce process gases for oxidation, diffusion or crystal growth. A gas exhausting port 305 is also provided to the chamber 300 in order to exhaust gas from the chamber 300. A quartz discharging tube 306 is connected to the reaction chamber 300; this tube 306 is also connected to a microwave supply 308 through a wave guide 307, whereby electric discharge will take place in the tube 306. Etching gases for an oxide film formed on the substrates 301 are introduced through the other end 309 of the tube 306 and through a gas inlet 310 provided to the reaction chamber 300. The gas introduced into the reaction chamber 300 through the inlet 310 is diffused by the dispersion means 211, which has many holes to facilitate uniform reaction. The reference numeral 311 is a valve which separates the discharging part from the reaction chamber.

The process for the oxidation of a substrate 301 made of single crystal silicon, using the apparatus mentioned above, will now be explained.

First, the reaction chamber 300 is evacuated; then $NF_3$ gas and $NH_3$ gas are introduced through the gas inlet 309—using flow rates 30 sccm (standard cubic centimeter) and 200 sccm respectively so as to hold the pressure of the reaction chamber to 0.5 torr. By this time, substrates of single crystal silicon have been placed in the chamber 300. These substrates have been covered with native oxide about several tens of Å thick. The oxide on the substrate is removed perfectly by applying microwave discharge to $NF_3$ and $NH_3$ gases for 10 minutes. At this time a thin film is formed on the substrates; however this is removed by heating the substrates. The process mentioned above is carried out while holding the temperature of the chamber 300 at room temperature. In the next step, the valve 311 is closed so as to halt the supply of $NF_3$ and $NH_3$ gases. An inactive gas such as Ar gas is then introduced into the reaction chamber 300 through the gas inlet 304; until atmospheric pressure is reached. The inactive gas is introduced to avoid entrance of oxygen and water into the chamber 300—thus preventing oxidation. The substrates 301 are heated to 1000° C. in the next step; the thin film on the substrates 301 is removed by this heating, and clean surfaces of silicon are exposed. An oxidation gas such as $O_2+H_2O$ or $O_2+HCl$ gas is then introduced instead of said inactive gas through said gas inlet 304 into the chamber 300. As a result, the surfaces of the silicon substrates are oxidized in a known manner.

The silicon dioxide film formed on a silicon substrate by the method mentioned above does not include a native oxide film, as well as the oxide film formed by the thermal oxidation method, according to the third embodiment of this invention mentioned hereinafter. Therefore, the oxide film remarkably improves the voltage property of devices, compared to devices not subjected to the above mentioned surface processing method. The leakage current property of devices is also improved.

The $NF_3$ and $NH_3$ gases used for removal of native oxide film are discharged together and introduced through the gas inlet 309 in the embodiment mentioned above. It is however possible for only $NF_3$ gas to be discharged, and for $NH_3$ gas to be introduced through the gas inlet 310, and diffused by the gas dispersion means 211.

Alternately, it is possible for a discharging tube to be provided to the gas inlet 310, and for $NF_3$ gases to be introduced through the inlet 310. In this case, radicals which are formed by the discharge of $NF_3$ and $NH_3$ gases can be supplied uniformly over the substrates 301 making uniform removal of native oxide film possible.

The embodiment mentioned above can be easily altered for crystal growth and diffusion of silicon simply by changing process gases to suitable ones. In these processes, a native oxide film can also be removed as a pretreatment before the processes, in the same manner mentioned above.

Microwave discharge is used to activate the gases in the above-mentioned embodiment; however heat activation, activation by charged particle beam, light activation, and activation by a reaction with neutral gas radicals can also be used with this method.

Removal of a native oxide film can also be possible with other combinations of a halogen-containing gas and a basic gas, as in Embodiment 1.

Embodiment 3

The thermal oxidation process for silicon will be explained next using a surface processing apparatus, according to the third embodiment of this invention.

Figure 4:
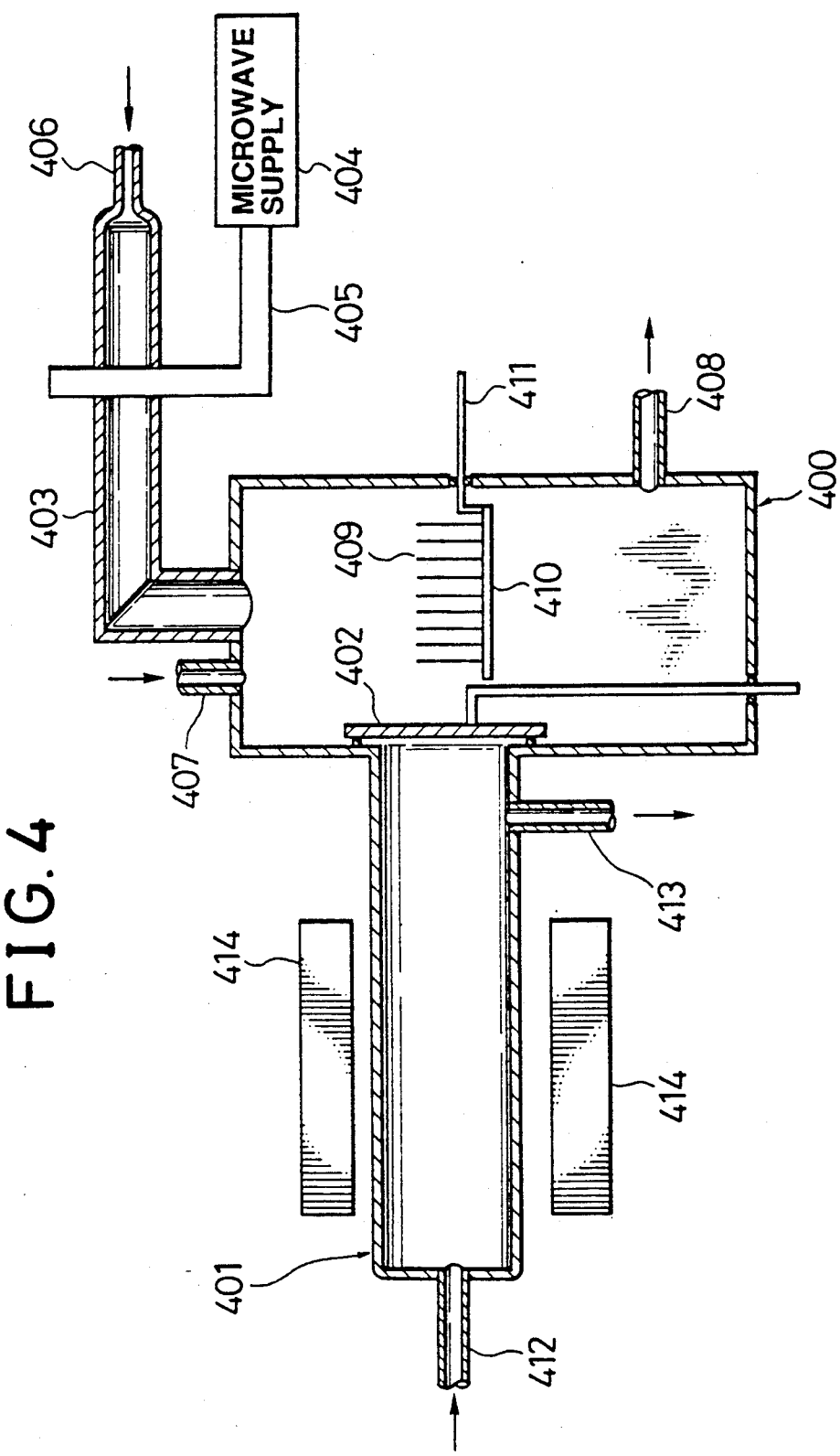

FIG. 4 shows a schematic view of an oxidation apparatus used in this embodiment. This apparatus is comprised of a pretreatment room 400 and a main treatment room 401 for thermal oxidation. These rooms 400 and 401 are separated by a gating valve 402 so as to permit separate vacuums to exist. The deposition of a silicon dioxide film containing impurity atoms is carried out in this main treatment room 401.

A quartz discharging tube 403 is provided in the pretreatment room 400. Microwaves are applied to the tube through a wave guide 405 from a microwave supply 404. The gases introduced into the tube 403 through the gas inlet 406 are discharged and activated by the microwaves to produce radicals. These radicals are introduced into the pretreatment room 400. There is also a gas inlet 407 to the pretreatment room 400 for introduction of raw gases. The gases introduced into the room 400 are exhausted through the gas exhausting port 408.

Substrates 409 are stacked in a quartz boat 410 placed in the pretreatment room 400. The substrates can be carried between the pretreatment room 400 and main treatment room 401 by a carrying mechanism 411 through the gating valve 402 without exposure to the air.

There is also a gas inlet 412, a gas exhausting port 413, and a heater 414 in the main treatment room 401.

A cooling means for cooling the substrate 409 is provided with the pretreatment room 400. By the cooling means, it is possible to cool the substrate to −50° C.

Figure 5A:
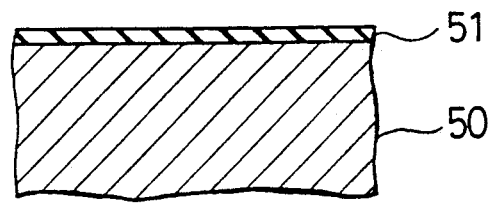
FIGS. 5a to 5e are cross-sectional views of a substrate, showing steps of a surface processing method, according to an embodiment of this invention.

The thermal oxidation process using the apparatus shown in FIG. 4 will now be explained by referring to FIGS. 5a to 5e, which are cross sectional views of a substrate. A p-type silicon (100) wafer 50 having a resistivity 10 $\Omega$.cm and containing Boron impurity is used as the substrate 409 to be processed. Organic and heavy metal contaminants contained on the wafer 50 surface were removed in advance by treatment with alkali or acid; native oxide formed on the wafer 50 were removed by treatment with dilute hydrofluoric acid. However, the substrate is rinsed by water or exposed to the air after said treatment; therefore, a native oxide film 51 about 10Å thick is formed on the substrate surface, as shown in FIG. 5a. The substrate is then stacked on the boat 410 placed in the pretreatment room 400, and the room is evacuated to a vacuum. NF$_3$ gas is introduced into room 400 through the inlet 406 with a flow rate 10 sccm; and NH$_3$ gas is introduced through the inlet 407 with a flow rate 100 sccm.

Figure 5B:
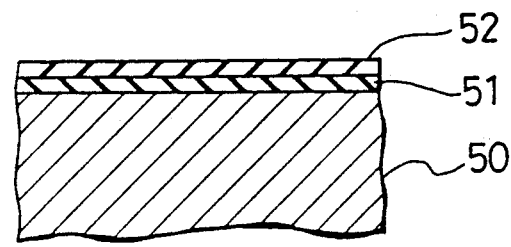

During the gas introduction, the gas from the inlet 406 is discharged. As a result, a thin film 52 is formed on the substrate surface as shown in FIG. 5b.

In the next step, the gas supply is stopped, and the gas in the room 400 is evacuated. The substrate 409 is then carried into the main treatment room 401 by opening the gating valve 402.

Figure 5C:
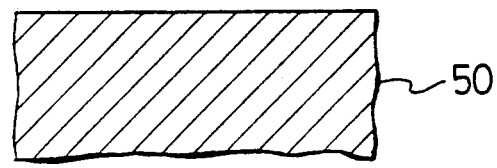

Ar gas as an atmospheric gas flows into the main treatment room 401, and the central part of the room 401 is maintained at 800° C. It takes about 30 minutes to carry the substrates 409 to the central part of the room 401 from room 400. During this period, the temperature of the substrates becomes high, and the thin film is sublimated. Thus, the thin film is completely removed with the native oxide film when the substrates are at the center of the room 401; and a clean surface of silicon is obtained as shown in FIG. 5c.

Figure 5D:
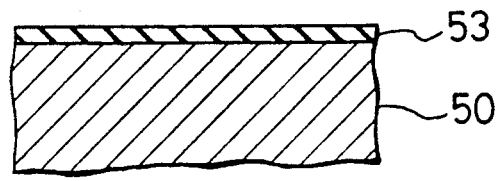
Figure 5E:
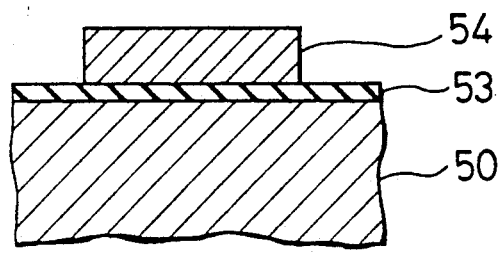

In the next step, the supply of Ar gas is stopped, while oxygen gas is introduced into the room 401 for 60 minutes. As a result, a silicon dioxide film 53 having about a 50Å thickness is formed on the clean surface of the substrates 409 as shown in FIG. 5d. In order to evaluate the electric property of the silicon dioxide film 53, a MOS capacitor is fabricated by depositing and patterning a silicon polycriatalline film 54 containing P atoms on the substrates 409, as shown in FIG. 5e.

Figure 6:
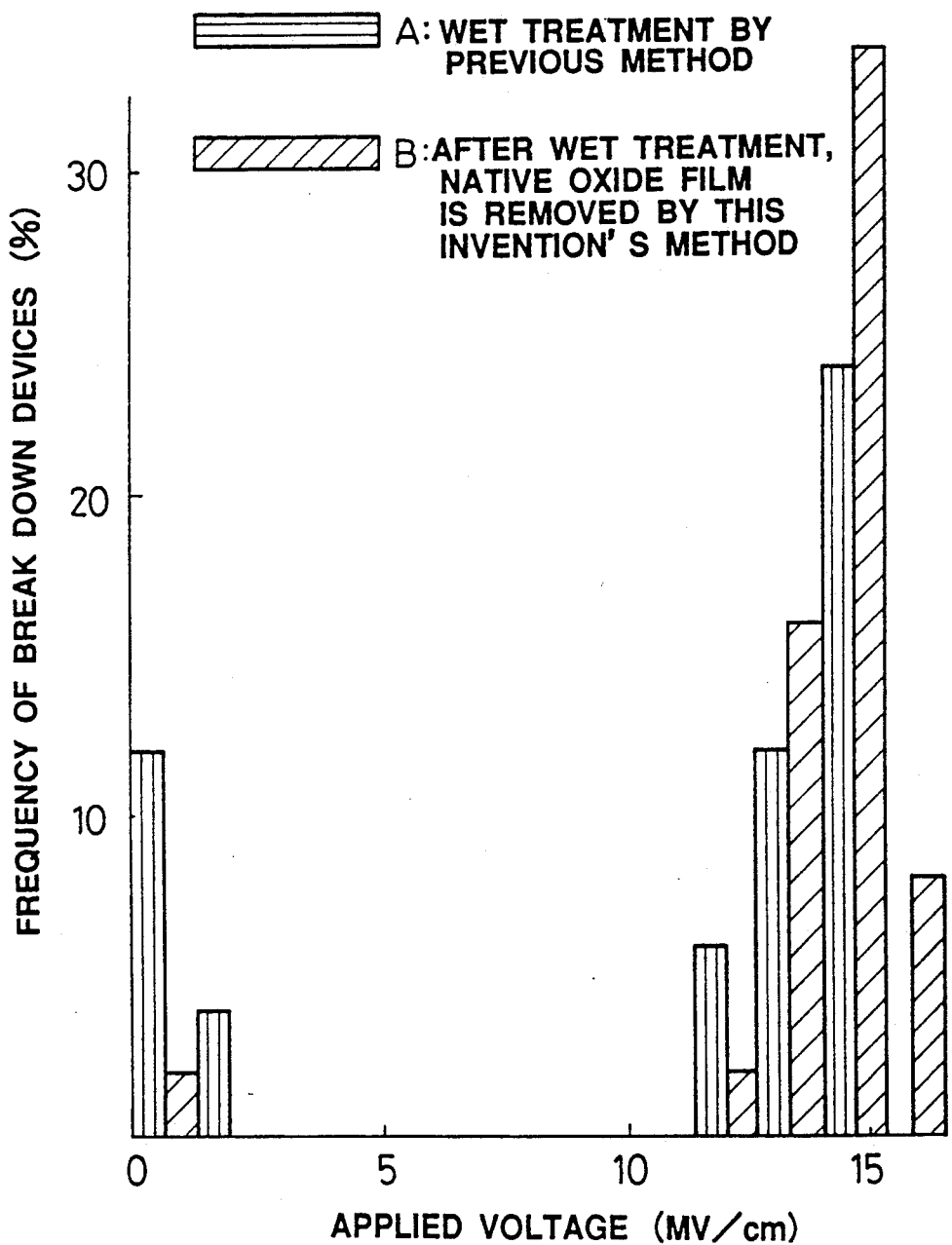
FIG. 6 is a graph showing the relation between the applying voltage and the frequency of breakdown of devices obtained by a method according to this invention, and by a previous method.

The strength of dielectric breakdown of the obtained oxide film was measured on the MOS capacitors. The results of the measurement will now be explained. FIG. 6 is a graph showing the relation between the frequency of dielectric breakdown and the voltage applied to capacitors having 10mm$^2$ dimension.

At the measurement, a capacitor was thought to be broken down when a current through it exceeded $10^{-6}$A per 1 cm$^2$. Sample A was obtained by forming an oxide film on the substrates after a conventional wet treatment with dilute hydrofluoric acid. About one fourth of the samples A were broken down, with relatively low applied voltage such as below 1 MV/cm$^2$. On the other hand, only 3% of sample B obtained by forming an oxide film on the substrates after the above-mentioned removal treatment for native oxide was broken down with relatively low applied voltage.

From the results mentioned above, it is understood that the uniformity of the oxide film is improved, and crystal defects causing dielectric breakdown are decreased for the sample B. The latter are fabricated by forming oxide film after removing native oxide film from the substrates, using the apparatus shown in FIG. 4.

Looking at the high voltage area over 10 MV/cm, the maximum withstand voltage of sample A was 14 MV/cm; while it was 15 MV/cm for sample B. Thus, the maximum withstand voltage of sample B is 1 MV/cm higher than that of sample A.

The quality of the oxide film is also improved, not only due to the removal of native oxide film from the substrates, but to the decrease of metal contaminants in the substrates.

In fact, after the treatment using the apparatus shown in FIG. 5, it has been found that the contamination by alkali and heavy metals in the substrates decreases about by 50% to 90%. This shows that the metals and heavy metals contained in the native oxide film were removed along with the removal of the film.

The above embodiment is explained using the formation of a thermal oxide film on a single crystal silicon as an example. It is also possible to apply this embodiment to the formation of an oxide film on metal or other semiconductor substrates. It is more advantageous in cases of polycrystalline silicon containing P as an impurity than in cases of single crystal silicon. This is because the polycrystal silicon containing P, which is as important as a single crystal silicon as a composite material for LSI, has a native oxide which is relatively thick: 20 to 30Å.

In the above-mentioned embodiment, metal contaminants of a silicon surface are removed together with the removal of native oxide. It is, however, possible to remove metal contaminants contained within silicon substrates by using a sacrificial oxidation process, or by using a strong basic gas such as $(CH_3)_2NH$ gas which is stronger than $NH_3$ gas. The result is improved film quality.

Embodiment 4

The fourth embodiment of this invention uses the apparatus shown in FIG. 4 to perform an impurity diffusion process. In this process, substrates used are the same ones used in the oxidation process mentioned above. Substrates having had a wet treatment are stacked on a boat placed in the pretreatment room 400, and $NF_3$ and $NH_3$ gases are introduced into the room to remove a native oxide film on the substrates, in the manner mentioned above.

The room 400 is then evacuated, and the valve 402 is opened to carry the substrates 409 into the main treatment room 401 by a carriage mechanism 411. During the transport the main treatment room is maintained at 700° C. by the heater 414, so that the thin film formed on the substrates is removed by sublimation. At the time, of course, a native oxide film is not formed on the substrates.

Figure 7A:
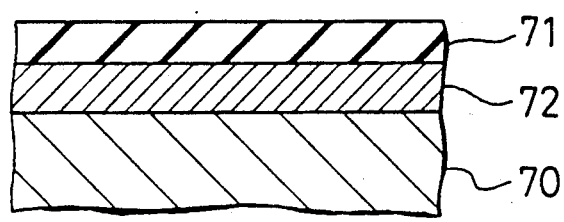
FIG. 7a is a cross-sectional view of a substrate, showing a step of an etching method, according to one embodiment of this invention.

The carriage mechanism 411 is taken out of the main treatment room 401 in the next step. The valve 402 is then closed, and tetraethoxysilane $(Si(OCH_2CH_3)_4)$ gas and triethoxyarsine $(As(OCH_2CH_3)_3)$ gas are introduced into the main treatment room 401 using the flow rate 50 sccm and 5 sccm respectively until the room pressure reaches 1 torr. The room 401 is maintained in this state for 30 minutes. A silicon dioxide film 71 containing As is deposited on the substrate 70 as shown in FIG. 7a—a cross sectional view of the substrate 70.

The thickness of the film is about 200Å. After formation of the film 71, $N_2$ gas is introduced into the room 401, and the substrates 70 are heated to 1000° C. The substrates are maintained at this temperature for 60 minutes. Then, As contained in the oxide film 71 is diffused into silicon substrates uniformly, so as to make an impurity region 72 of 0.15 $\mu$m depth having an n-type conductivity.

Figure 7B:
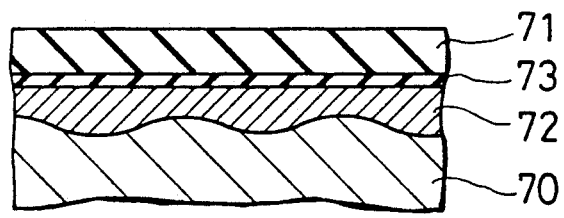
FIG. 7b is a cross-sectional view of a substrate, showing a step of an etching method, according to a prior art.

FIG. 7b is a cross sectional view of a substrate, showing a step of the diffusion process without removing a native oxide film so as to compare with the result of the embodiment mentioned above. As illustrated in FIG. 7b, a native oxide film 73 is formed on the substrate 70, and therefore this film 73 may become a barrier for the diffusion of As from the silicon dioxide film 71 containing As. As may also be segregated in the film. As a result, the impurity concentration of the n-type region 72a is low, and its impurity distribution is not uniform when compared with the n-type region 72, according to this embodiment mentioned above.

Figure 8:
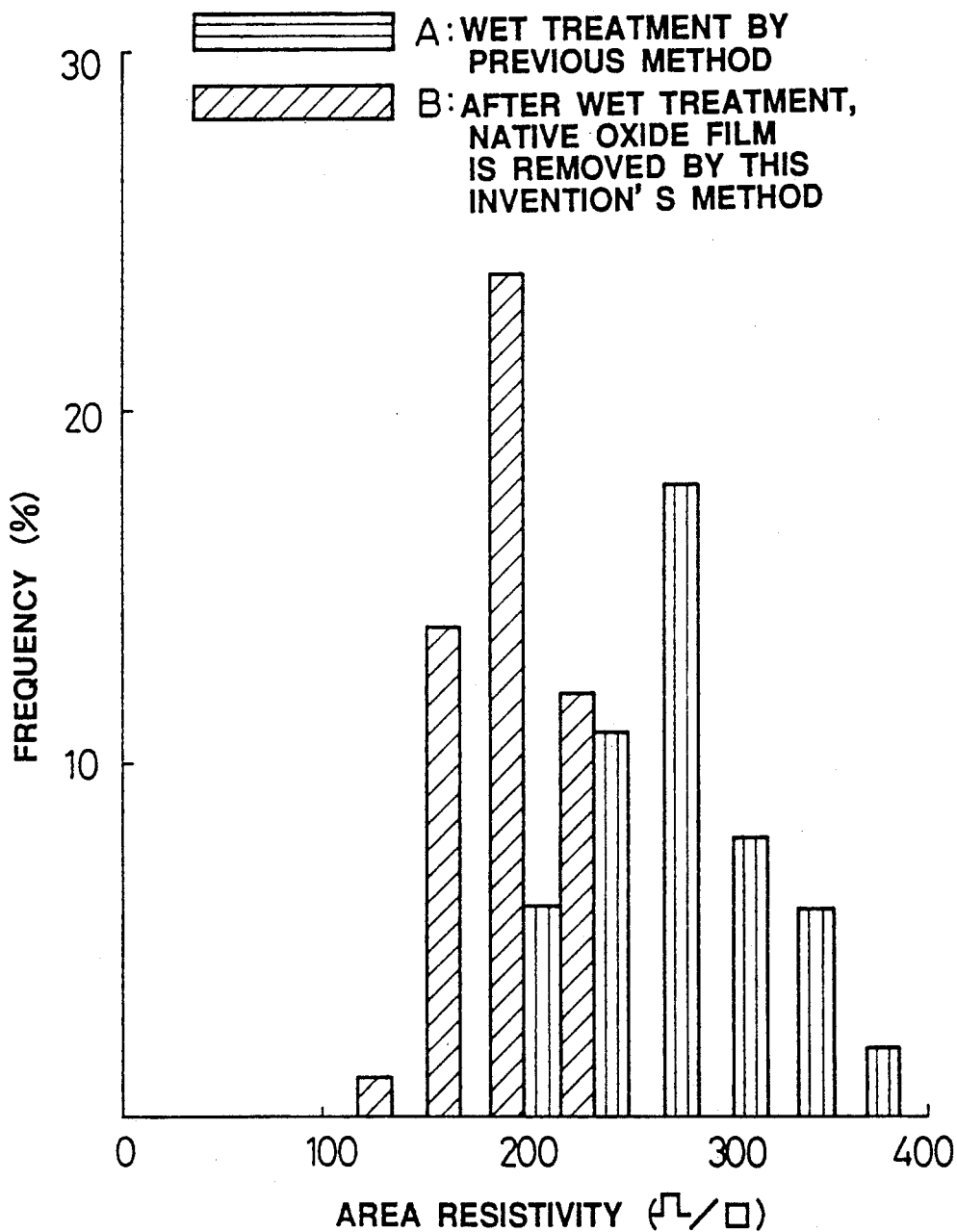
FIG. 8 is a graph showing the relation between the number of devices and the area resistivity of these devices obtained by a method according to one embodiment of this invention, and by a previous method.

FIG. 8 shows a histogram of resistivity for the impurity region 72 obtained by the method of this embodiment; and for the impurity region obtained by a prior method using only a wet treatment as a pretreatment. According to the histogram, it is readily understood that the resistivity of the impurity region obtained by the method according to this embodiment is lower than that of the impurity region obtained by the prior method. Note the small straggling of the resistivity in the region of this embodiment. It is thus possible to obtain an impurity region of high quality by this method without affected by the native oxide. Therefore, the electric properties of devices having said impurity region obtained by the method of this embodiment may be improved greatly.

Although As is used as an impurity in said embodiment, P or B may be diffused as impurities to form a diffusion layer when phosphine or diboran is used respectively instead of triethoxyarsine. The method of this embodiment can also be applied to other diffusion processes using various impurities.

In said embodiment there was a case in which an oxide film containing an impurity was formed as a diffusion source on a silicon substrate. However, the method in said embodiment may be applied to a vapor phase impurity diffusion process, in which a diffusion is carried out directly on a substrate, using a vapor of diboran or the like.

It is also possible in said method to remove the oxide film formed on the substrate as an impurity source. This is done by carrying the substrate into the pretreatment room 400 again, and introducing a halogen-containing gas and a basic gas such as $NH_3$ into the room 400 so as to etch the oxide film. The substrate may thus be processed efficiently. If the substrate is cooled during the process, the deposition amount of $NH_4F$ becomes greater. In this case, the etching rate may therefore be improved to shorten the etching time.

Embodiment 5

Figure 9:
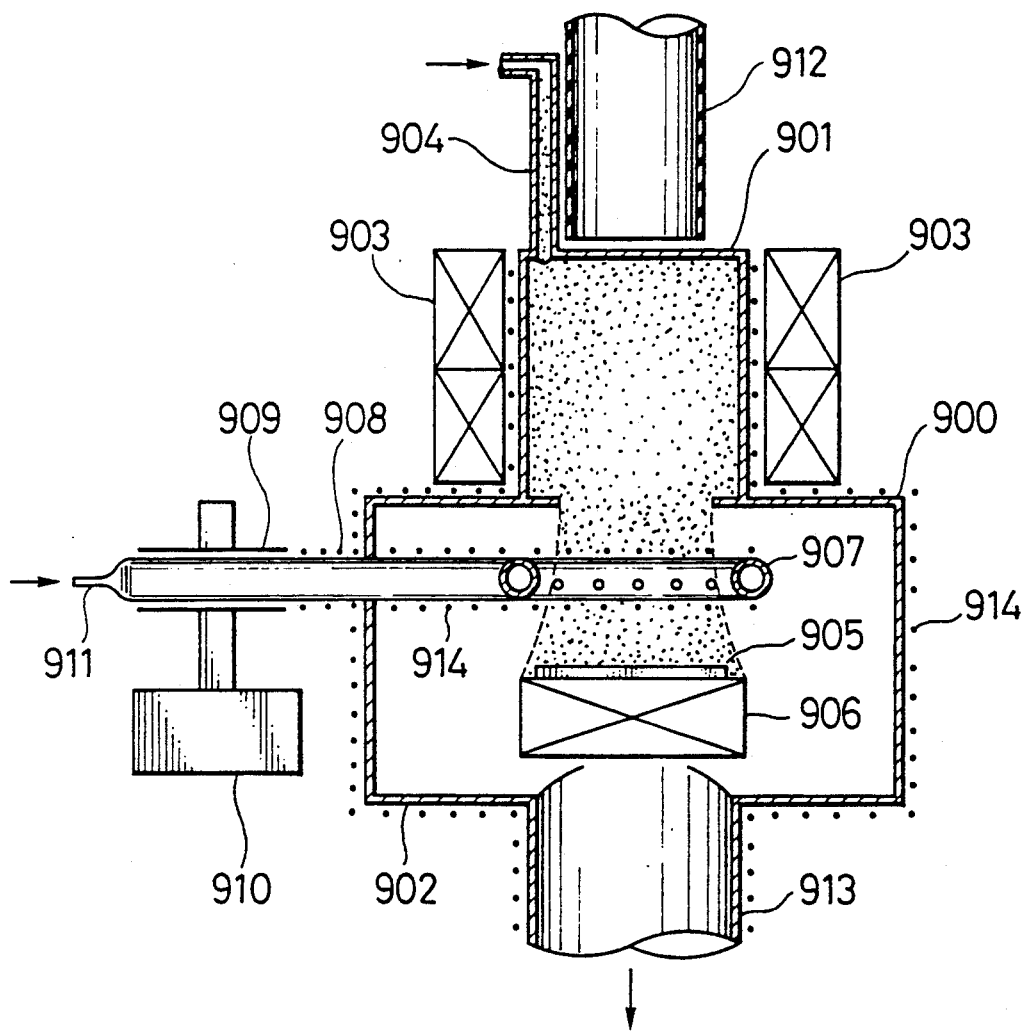

FIG. 9 shows a schematic view of a surface processing apparatus for etching according to the fifth embodiment of this invention.

In the figure, the reference numeral 900 shows a reaction chamber which is comprised of a discharging room 901 to generate electric discharges, and a treatment room 902 to carry out the process. Numeral shows a wave guide to supply microwave into the discharging room 901. A coil 903 generates a magnetic field inside the discharging room 901, in order to control the discharge generated. A discharge by electron cyclotorn resonance will be generated by the microwaves and the magnetic field mentioned above. A gas inlet 904 is provided in order to introduce etching gases into the discharging room 901. A substrate 905 to be processed is placed on the sample table 906 in the treatment room 902. Furthermore, a gas introducing tube 907 is provided in the room 902, and connected to a quartz discharging tube 908. This tube 907 has many holes so as to uniformly supply gases to the surface of the substrate 905. Gases for the removal of oxide film formed on the substrate 905 are introduced through tube 907 into room 902. The discharging tube 908 mentioned above is connected to a microwave guide 909 in order to generate a discharge inside the discharging room 908 when a microwave is supplied to the tube 908 from a microwave source 910. Gases for the removal of an oxide film are introduced through gas inlet 911 which is at the other end of the quartz discharging tube 908.

The gases in room 902 are evacuated via an exhausting port 913. A heater around the outside wall of the reaction chamber 900, the quartz discharging tube, and the gas introducing tube heats these portions. There is, moreover, a means for heating and cooling the substrate 905 to the sample table 905; though it is not shown in the figure.

This apparatus shown in FIG. 9 may be used in order to remove a native oxide film from a substrate before it is subjected to a dry etching process. The apparatus also permits removal of adhesives and contaminants made from oxide formed on the substrate surface after a dry etching process.

Using this apparatus to remove a native oxide film before dry etching may decreases the etching time and etching refuse. If a substrate is treated by a halogen-containing gas and a basic gas as an aftertreatment for an etching, materials adhered to a substrate surface during the etching, such as mask materials, contaminants from the components of a reaction chamber, and gases, may be removed, and a clean surface of the substrate may be obtained.

In this embodiment mentioned above, the etching process using the apparatus illustrated in FIG. 9 is explained. This apparatus can also be used for plasma CVD or the like in which an oxide or metal film is deposited on a substrate 905 by supplying deposition gases through the gas inlet 904.

If a native oxide film formed on a substrate is removed before said plasma deposition in the same way done in the embodiment mentioned above, the adhesion between the deposited film and the substrate may be improved.

Embodiment 6

Embodiment 6 is comprised of a surface processing apparatus, used especially for epitaxial growth.

Figure 10:
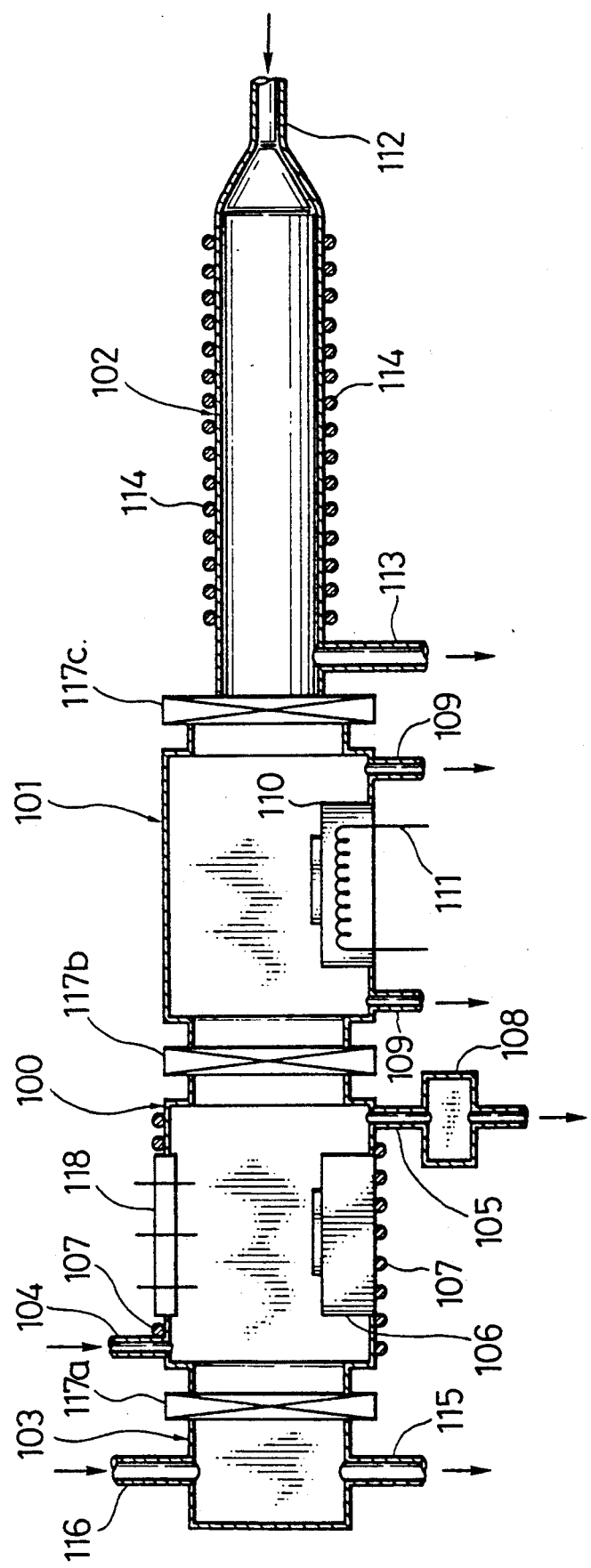

FIG. 10 is a schematic view showing an apparatus according to one embodiment of this invention. This apparatus is comprised of mainly a pretreatment room 100, a carrying room 101, a reaction room 102, and a preparation room 103. The pretreatment room 100 has a gas inlet 104 to introduce process gases into the room; a gas exhausting port 105 to evacuate gases from the room; a sample table 106 to hold a sample; a window 118 to transport light into the room; and a heater 107 to heat the walls of the room 100. A mechanism to fix a sample, that is a substrate to be processed, to the sample holder 106 by electrostatic force as well as a cooling mechanism are provided to the sample holder in order to fix the sample and cool it to $-100°$ C. An exhausting gas treatment apparatus is connected to the gas exhausting port 108.

There are two gas exhausting ports 109 provided; and a sample holder 110 in the carrying room 101. A heater 111 is buried in to the sample table 110 so that the sample can be heated to $+300°$ C. A gas inlet 112 and a gas exhausting port 113 are provided to the reaction room 102. There is also provided a coil 114 around the reaction room 102 in order to heat the sample in the room by radio heating. The coil 114 is connected to a high frequency supply.

In the preparation room 103, there is a gas exhausting port 115 to evacuate the room 103, and a gas inlet 116 to introduce non-activate gases such as $N_2$ gas into the room 103 so as to raise the pressure of room 103 to atmospheric pressure. As shown in FIG. 10, the apparatus is a load-lock type as a whole, and therefore each room 100, 101, 102, and 103 is separated by respective gating valves 117a, 117b, and 117c. A carrying mechanism is provided to carry the sample through these rooms without exposing it to the atmosphere.

The epitaxitial process will be explained, using the apparatus shown in FIG. 10. First, a silicon substrate to be processed is washed with alkali or acid solution in order to remove organic and metal contamination. Then, a native oxide film formed on the substrate during prior processes is removed by dilute hydrofluoric acid. After this, the silicon substrate is placed in the preparation room 103, which is then evacuated. The substrate is then carried into the pretreatment room 100 by opening the gating valve 117a. The sample holder 106 is maintained at 5° C. during the process.

During the evacuation of preparation room 103, a native oxide film of about 10Å is formed again on the surface of the substrate. $NF_3$ gas and $NH_3$ gas are introduced through gas inlet 104 to produce a partial pressure; of 0.05 torr and 0.25 Torr respectively. At the same time, ArF laser light having a wavelength of 193 nm is shone on the substrate through window 118 for 10 minutes. After laser illumination, a thin film is formed on the substrate. The substrate is then carried into the carrying room 101 by opening the gating valve 117b. The carrying room is evacuated in advance. The substrate is placed on the sample holder 110, and maintained at 200° C. for 10 minutes. The thin film is consequently removed by sublimation. At the same time, the native oxide is also removed. The gating valve 117c is opened next in order to carry the substrate into the reaction room 102, which is evacuated in advance. The substrate is heated to 900° C. in the reaction room, and $SiH_2Cl_2$ gas is introduced through gas inlet 112. An epitaxitial layer 10 nm thick is formed on the silicon substrate after maintaining there conditions for 20 minutes. It is found that the resistivity and the thickness of the epitaxial layer are uniform, and crystal defect cannot be seen. On the other hand, small eruptions are seen on a substrate which was not subjected to the native oxide removal process in pretreatment room 100; in addition crystal defects are seen on the boundary between an epitaxial layer and the substrate. Thus, an epitaxial layer of excellent quality can be obtained using the apparatus shown in FIG. 10.

Figure 11:
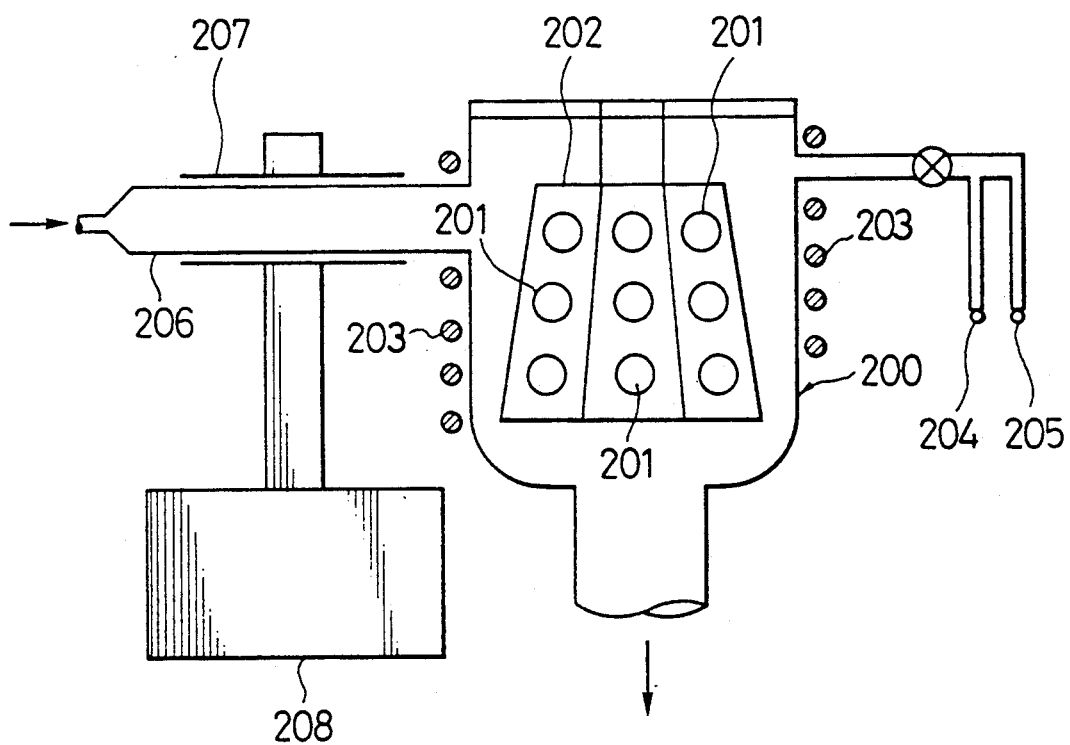

Another apparatus for epitaxial growth is shown in FIG. 11. In this apparatus, a susceptor 202 is placed in a reaction chamber 200 to hold substrates 201. A coil 203 is provided around the reaction room 200 to heat the substrates 201 by a microwave. This coil 203 is connected to microwave supply. Reaction gases are introduced through gas inlets 204 and 205, which are connected to the reaction chamber 200. A quartz discharging tube 206 is provided to the reaction chamber 200, and microwaves of 2.45 GHz generated from the microwave supply 208 are applied to this tube 206 by way of applicator 207.

An example of surface processing by this apparatus shown in FIG. 11 will now be explained. First, silicon substrates 201 are placed on the susceptor 202 in reaction chamber 200; and this chamber 200 is evacuated. Then, $NF_3$ gas is introduced into the quartz discharging tube 206 with a flow rate of 60 sccm. $NH_3$ gas is introduced into chamber 200 through gas inlet 204 with a flow rate of 60 sccm, so as to maintain the pressure of chamber 200 at 0.2 torr. Under these conditions, the microwave supply 208 is turned on to generate a discharge for 10 minutes. A thin film is consequently formed on the surface of the substrates. After stopping the discharge, and evacuating the gases, the substrates are heated to 100° C. by microwave heating, and maintained at this condition for 10 minutes. The thin film formed on the substrate surface mentioned above is sublimated by this treatment, and therefore the native oxide film formed on the substrates is removed along with the thin film. The substrates 201 are then heated to 900° C., and $SiH_2Cl_2$ gas is introduced in order to grow an epitaxial layer on the substrate surface. This process is carried out for 20 minutes, and an excellent epitaxial layer of 10 μm thickness is formed on the substrates.

Embodiment 7

Figure 12:
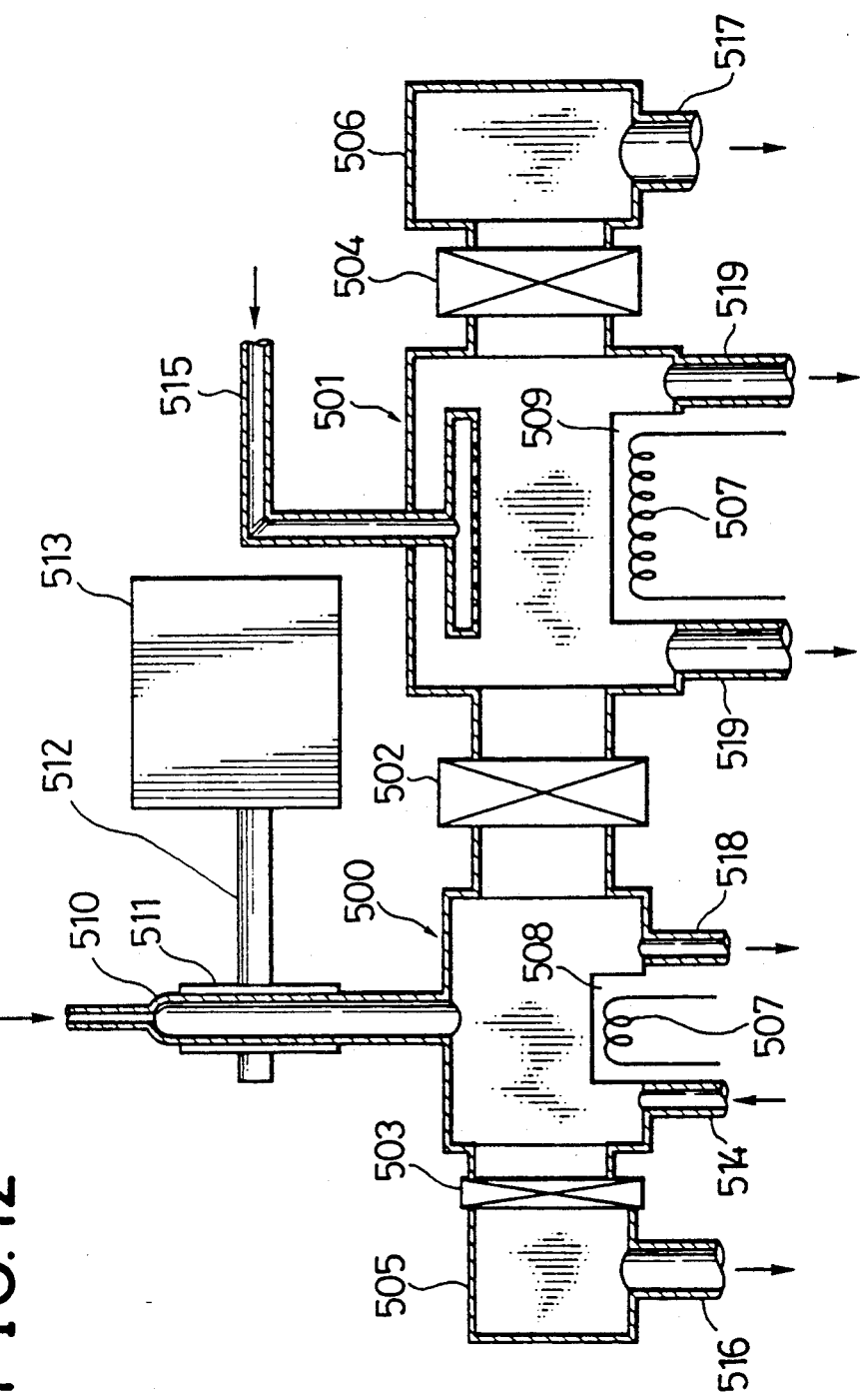

FIG. 12 is a schematic view showing a surface processing apparatus according to an embodiment of this invention; it is used only to grow a thin tungsten layer selectively deposited on a substrate to be processed. This apparatus comprises a pretreatment room 500, and a deposition room 501. These rooms are separated by a gating valve 502. This apparatus is a kind of load lock type as a whole, so that pretreatment room 500, and deposition room 501 are connected to a load room 505, and an unload room 506 respectively through other gating valves, 503 and 504. Sample tables 508 and 509 are provided, having heaters 507 in the respective rooms 500, and 501. A quartz discharging tube 510, an applicator 511, a wave guide 512, and a microwave supply 513 are connected to the pretreatment room 500 so as to transport long-life radicals produced by microwave discharge to the pretreatment room 500. A gas inlet 514 is also provided in order to introduce gases into room 500 without passing the discharging tube 510. On the other hand, there is provided a gas inlet 515 to the deposition room 501 in order to introduce gases for deposition, such as a mixture of $WF_6$ gas, and $H_2$ gas. $WF_6$ and silane gases mixed with hydrogen or argon gases, and $WF_6$ gas mixed with hydrogen, and $WF_6$ gas mixed with argon can be used as the deposition gases mentioned above. Means 516, 517, 518, and 519 for exhausting gases are provided to the load room 505, unload room 506, pretreatment room 500, and deposition room 501 respectively.

Tungsten selective growth as an example will now be explained, using the apparatus according to the embodiment shown in FIG. 12.

Figure 13:
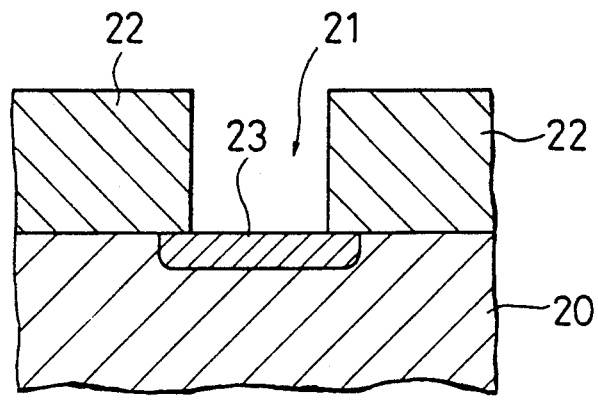
FIGS. 13a to 13c are cross-sectional views of a substrate, showing steps of a method, according to one embodiment of this invention.
Figure 13:
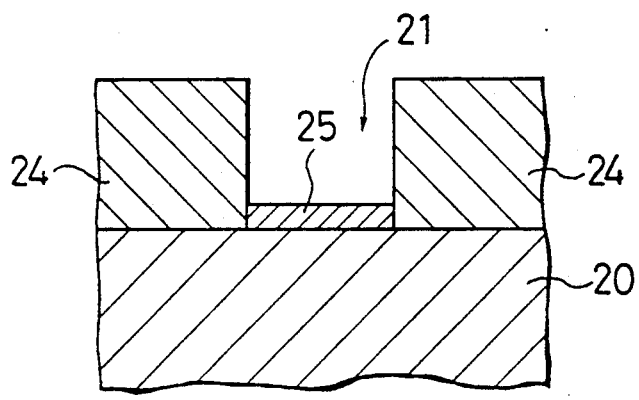
Figure 13:
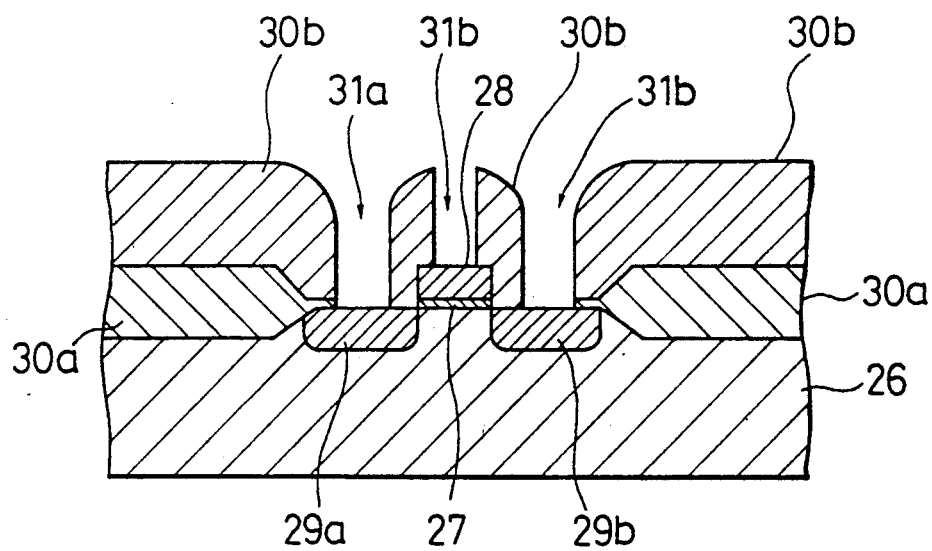

First, three samples A, B, and C shown in FIGS. 13a, 13b, and 13c respectively are prepared. Sample A is prepared as follows: a silicon substrate 20 is covered with a PSG film 22 having an aperture 21; and an impurity is diffused into the silicon substrate through aperture 21 to form the impurity-diffused layer 23, as shown in FIG. 13a. The sample B is prepared as follows: a silicon substrate 20 is covered with a BPSG film 24 with aperture 21, and a metal layer 25 made of an aluminum alloy etc. is formed on the bottom surface of the aperture 21 as shown in FIG. 13b. Also, sample C is prepared as shown in FIG. 13c, which is a cross sectional view showing one step in fabricating a MOS transistor. A gate electrode 28 made of polycrystalline silicon is formed on a silicon substrate 26 via a gate oxide film 27; and impurity-diffused layers 29a, and 29b as source and drains of a transistor are formed connected to both ends of the gate electrode 28. In the figure, 30a shows a field oxide film; and 30b shows an insulating film. 31a and 31b are contact holes respectively.

Those samples A, B, and C will be subjected to a treatment mentioned below using the apparatus shown in FIG. 12.

First, these samples are placed in load room 505, which is then evacuated. The samples are then carried into pretreatment room 500 after opening the gating valve 503. Room 500 is evacuated to less than 0.001 torr in advance; and $NH_3$ gas is introduced into the quartz discharging tube 510 with a flow rate of 30 sccm. At the same time, $NH_3$ gas is introduced into room 500 with a flow rate of 300 sccm via gas inlet 514 without being discharged. As a result, the gas pressure of room 500 is maintained at 0.3 torr. At these conditions, microwave discharge is generated in tube 510 for 5 minutes; and the substrate is heated while pretreatment room 500 is being evacuated. After sufficient evacuation, the gating valve is opened to carry the substrate into the deposition room 501. The substrate which is carried onto the sample table 509 in the deposition room 501 is heated to 350° C. by heater 507, which is a temperature for selective growth of tungusten. Deposition gases such as the aforementioned mixture of $WF_6$ and $H_2$ are then introduced into room 501 so as to deposit tungusten onto the substrate. After the deposition process, the cross sections of the sample A, B, and C were analysed by SEM to examine each deposition state of the samples. It was seen that an excellent tungusten layer is formed selectively on only the diffused layer of sample A, the metal layer of sample B, and the diffused layer, and gate electrode of sample C respectively. On the other hand, a tungusten was not formed on a substrate which was not subjected to the pretreatment of room 500.

As mentioned above, it is possible to form an excellent tungusten layer on a particular area of a substrate surface if the tungusten growth process is performed after the removal of native oxide formed on the substrate surface. Contact holes and through holes formed on the substrate therefore do not include a native oxide film which would decrease the resistivity of these holes. A device having a contact resistivity of 10Ω for a contact size 1.0 μm φ was experimentally obtained from a tungusten layer formed on n⁺type silicon substrate; and a device having a contact resistivity of 200Ω for the same size was obtained from a tungusten layer formed on p⁺type silicon substrate.

In the before-mentioned embodiment, the mixture of $NF_3$, and $NH_3$ gases may be discharged together, and introduced into the pretreatment room. Alternatively, just one of the gases may be discharged, and introduced into the room; while the other may be introduced into the room directly without being discharged. Gases which contains at least a halogen atom such as $N_2F_4$, $XeF_2$, $ClF_3$, $SF_6$, and $C_xF_y (x \geq 1=, y = 2x+2)$ gas can be used instead of $NF_3$ gas; and basic gases such as $AsH_3$, $PH_3$, $(CH_3)_2NH$, $N(CH_3)_3$, and $NH_2(CH)$ can be used instead of $NH_3$ gas By changing the combination of gases, the optimized flow rate and the pressure of these gases may be slightly altered; however, this invention may be valid as far as using any combination of a halogen containing gas, and a basic gas.

The deposition room used in the embodiment according to FIG. 12 is a type where only one substrate can be placed, but it is possible to extend this embodiment easily by use of a barrel type chamber to treat a plurality of substrates.

Furthermore, other metals having a high melting point such as molybdenum and tantalum; or other metals, and polycrystalline silicon, for example can be used as a deposition material to form a thin film. When forming a polycrystalline silicon layer, a substrate which has been subjected to pre-treatment to remove a native oxide film is placed in a deposition room maintained at 650° C. A polycrystalline silicon layer may be formed on the substrate when $SiH_4$ gas is introduced into this room.

Consider the case of filling up the contact holes 31a, and 31b shown in FIG. 13c with polycrystalline silicon. This polycrystalline silicon layer will be formed on a substrate from which a native oxide film has already been removed; and therefore the conduction in the said polycrystalline silicon layer, the diffusion layers 29a, 29b, or gate electrode 28 may be significantly improved.

Embodiment 8

Figure 14:
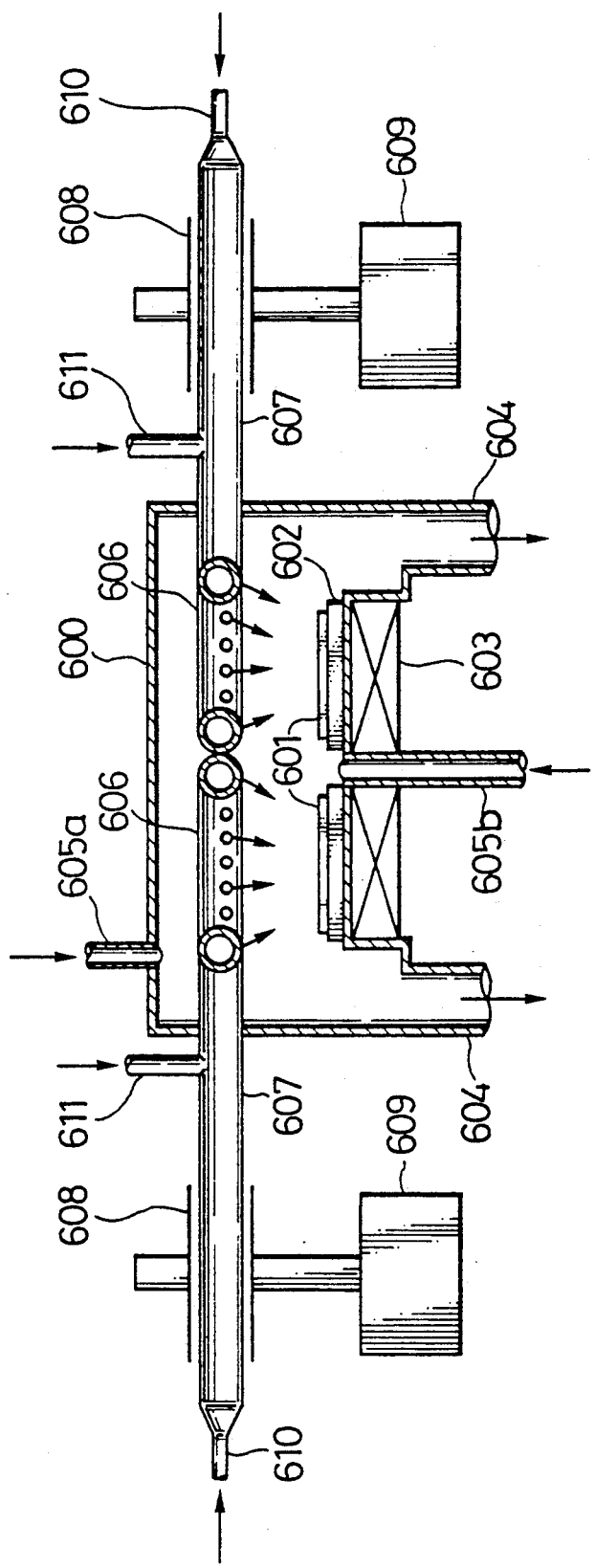

FIG. 14 is a schematic view showing a surface processing apparatus for depositing a thin film, according to another embodiment of this invention. This apparatus differs from the apparatus shown in FIG. 7 as follows. In this apparatus, a pre-treatment and a deposition process can carried out in a same room; whereas these processes are carried out in different rooms in the apparatus shown in FIG. 7.

In FIG. 14, the reference numeral 600 is a treatment chamber where the main reaction takes place. A substrate 601 to be processed is fixed on a sample table 602 electrostatiscally, or mechanically in said chamber 600. 603 is a means for heating the substrate 601, which is set under the sample table 602. This chamber 600 can be evacuated through two exhausting ports 604. Gas inlets 605a, and 605b for introducing deposition gases are connected to the treatment chamber 600. These deposition gases are the same ones used in said embodiment 7. Furthermore, means 606, 606 are provided in the chamber 600 for supplying a halogen-containing gas, and a basic gas such as $NF_3$, and $NH_3$ gases, which are used to etch or remove oxide film, uniformly from the substrate 601. These gas supplying means 606 are connected to quartz tubes 607 which are placed outside of the chamber 600. Each quartz tube 607 is connected to a microwave guide 608 respectively, and recieves microwaves from the microwave supply 609, 609 so as to cause electric discharge in quartz tube 607, 607 respectively. The etching gas inlet 610, and another gas inlet 611 are provided to each quartz tube 607. The gas inlet 611 is placed in a down flow area of the discharge within the tube 607 to mix up gases from the gas inlet 610.

Using the surface processing apparatus mentioned above, it is possible to obtain the same advantage obtained with the apparatus illustrated in embodiment 7.

Embodiment 9

The method for forming a contact hole on a substrate according to one embodiment of this invention will now be explained.

Figure 18:
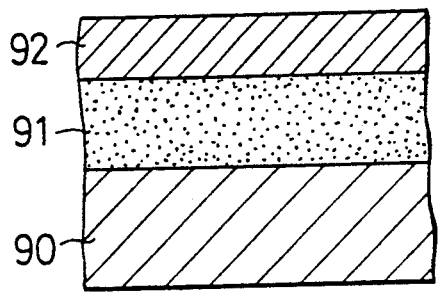
FIGS. 18a to 18h are cross-sectional views of a substrate, showing steps of a method according to one embodiment of this invention.
Figure 18:
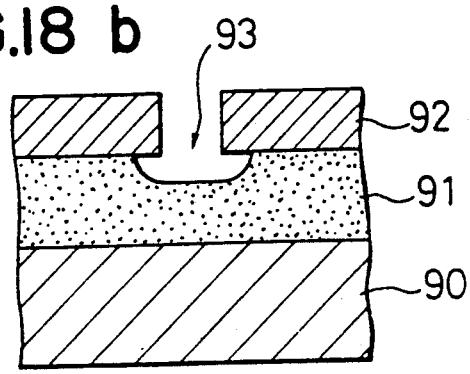
Figure 18:
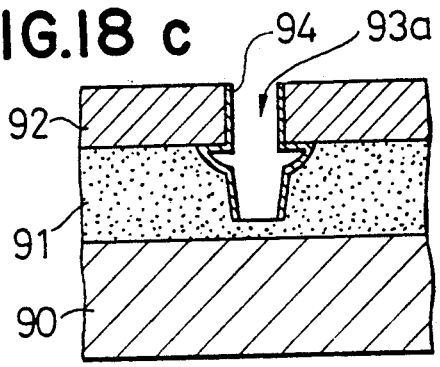
Figure 18:
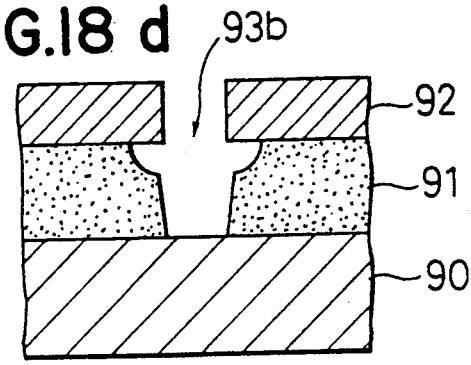
Figure 18:
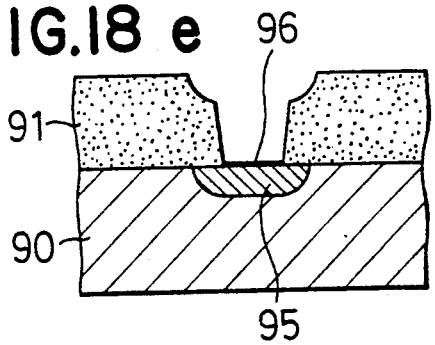
Figure 18:
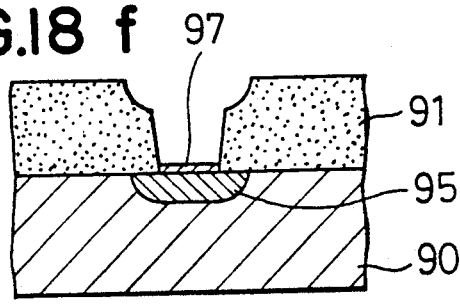
Figure 18:
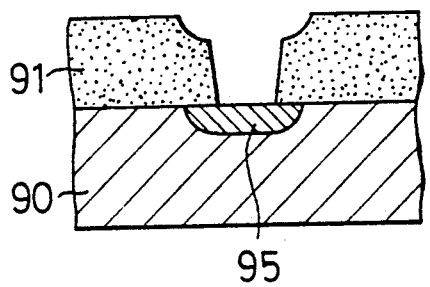
Figure 18:
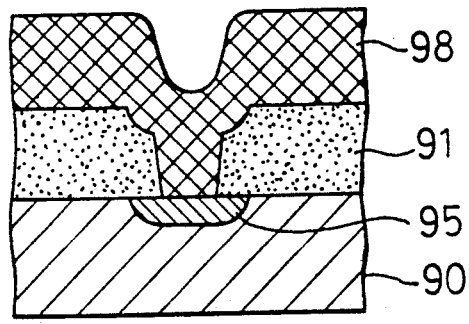

FIGS. 18a to 18h are cross-sectional views of a substrate, showing each step in the formation of a contact hole, using the apparatus shown in FIG. 1. First, an insulating silicon dioxide layer 91 of 1.5 μm thickness is formed on a p-type silicon substrate 90 by the CVD method. This layer 91, then, is covered with a photoresist layer 92, as shown in FIG. 18a. Photoresist in a part 93 ($\phi = 1$ μm) of the photoresist layer 92 is removed by the photolithograghy technique to make opening 93. Then, the substrate is placed on the sample table in the vacuum chamber shown in FIG. 1. While maintaining the temperature of the substrate at 25° C. $NF_3$ gas at 0.05 Torr and $NH_3$ gas at 0.45 Torr are introduced through the gas inlet 13a. These gases are subjected to discharge for 10 minutes by applying microwaves of 400 W to the discharging tube 14. The substrate is then heated and maintained at 120° C. for 30 seconds. The discharging step at 25° C. and heating step are repeated alternately until the silicon dioxide film 91 is etched by about 4000 Å.

As a result, the silicon dioxide film is etched isotropically, and the opening radius of the silicon dioxide film 91 gets wider than that of the photoresist mask 92, as shown in FIG. 18b. At this time, no damage is caused on the surface of the silicon dioxide film 91. The reason of this will be explained as follows. A molecule of $NH_4F$, which is a haloid used to etch silicon dioxide, is greater than a F atom. $NH_4F$ molecules do not therefore enter into the silicon dioxide film 91, and do not form silicon oxyfluoride.

The silicon dioxide film 91 is then etched by 1 μm by a reactive ion etching method, using a gas mixture of $CF_4$ and $H_2$ to form a hole 93a, leaving a small portion of silicon dioxide film.

Due to this reactive ion etching, an adhesive layer 94 of silicon dioxide or the like is formed on the side walls of the silicon dioxide film 91, and on the resist layer 92, as shown in FIG. 18c.

In the next step, the silicon dioxide film is etched again by forming and removing a thin film under the same conditions mentioned above, using the apparatus shown in FIG. 1. As a result, the contact hole 93b in the silicon dioxide film 91 is opened completely, as shown in FIG. 18d. At the same time, the adhesive layer 94 on the side walls of the hole is also removed.

An n-type diffused region 95 is formed next in the contact area, by a diffusion process using $POCl_3$ gas. The photo-resist mask 92 is removed by an $O_2$ plasma as shown in FIG. 18e, using a barrel type plasma apparatus. At this time, a native oxide film 96 is formed on the contact area of the surface of the silicon. Then, this sample is placed on the sample table in the reaction chamber shown in FIG. 1; and only a thin film 97 shown in FIG. 18f is formed on the substrate under the same conditions mentioned above. In the next step, the substrate is carried into a sputtering apparatus and placed on a sample table. The apparatus is evacuated, and heated so as to maintain the sample temperature at 120° C. for 30 seconds. Following this step, the thin film 97 and the native oxide film 96 are removed together, as shown in FIG. 18g. If the sample is treated in order to remove the thin film in the apparatus shown in FIG. 1, a new native oxide film will be formed by exposure to the air while the sample is carried into the sputtering apparatus. This is the reason why the removal of the thin film 97 is carried out in the sputtering apparatus.

In the next step, the sample is subjected to a sputtering of Al-Si alloy in a vacuum so as to deposit the alloy on the surface of the sample. As a result, the contact hole is covered completely with that alloy as shown in FIG. 18h.

The contact hole is formed on the sample without leaving any adhesives on its side walls; and without damaging the silicon dioxide film. Although this contact hole has a high aspect ratio, the opening of the hole is wide. The sputtering is therefore done without leaving any spots in the alloy layer; and the hole is completely covered with Al alloy.

Figure 19:
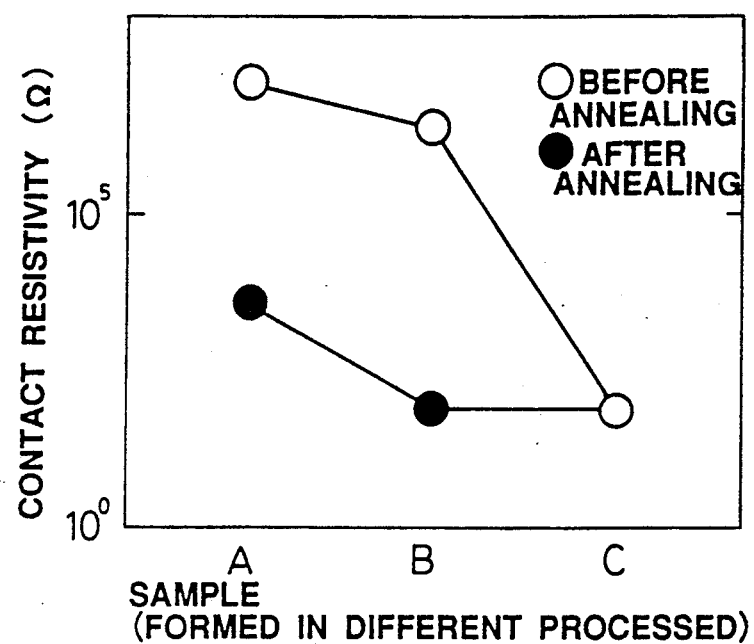
FIG. 19 is a graph showing the relation between the contact resistivity of devices and their fabricating steps illustrated in FIGS. 18.

The contact resistivity of the sample made by the method mentioned above was measured. FIG. 19 shows the result of the measurements for three samples. Sample C was fabricated by the method shown in FIGS. 18. Sample A was obtained by following the steps as far as the step shown in FIG. 18b. That is, the contact hole of the sample A was opened completely by a reactive in etching; and an alloy layer was deposited without removing a native oxide film on the contact area. Sample B was obtained by executing the steps shown in FIGS. 18, without executing the step of removing the native oxide film 96, shown in FIGS. 18e and 18f. The results from the samples A and B are shown in FIG. 19 for comparison to the results from sample C. A measurement result for samples after annealing (450° C., for 30 minutes) is also shown in the figure. From the figure, it can be seen that sample A has a very high resistivity, even following the annealing. The reason for this is believed due to the damage caused on the contact area by ion impact. On the other hand, the resistivity of sample B after the annealing decreased, although it was high immediately after fabrication. This result means that the last etching process for holes according to this invention does not damage the silicon of the contact area. The cause of lowered resistivity of samples following annealing is thought to be due to reduction of the native oxide film, by Al. The resistivity of sample C had a low contact resistivity immediately after the sample was fabricated; and it did not change after the annealing. The reason for this is thought to be that there was no native oxide film formed on the contact area.

As explained above, it is possible to fabricate a sample having a small contact area and low contact resistivity by the method of the said embodiment of this invention. Furthermore, it is possible to improve the reliability of a device made of that sample greatly because an annealing step is not needed in said method. A breaking of wire tend to be caused if a substrate is subjected to annealing.

In this embodiment mentioned above, silicon dioxide or the like adhering to the side walls of the hole at the reactive ion etching is removed by this method, using the apparatus shown in FIG. 1. Any adhesives formed by another etching process can also be removed by said method, provided that the main component of the adhesives is oxide of silicon or metal oxide. For example, adhesives are formed on both the side walls of the chamber and the back surface of the substrate either when silicon is etched by reactive ion etching using a silicon dioxide film as a mask; or when a deposition gas including silicon is added during the etching process. It was confirmed that these adhesives could be removed by this method because they are oxides of silicon.

Embodiment 10

Another method of etching silicon dioxides again uses the apparatus shown in FIG. 1. The explanation of this embodiment follows.

Figure 20:
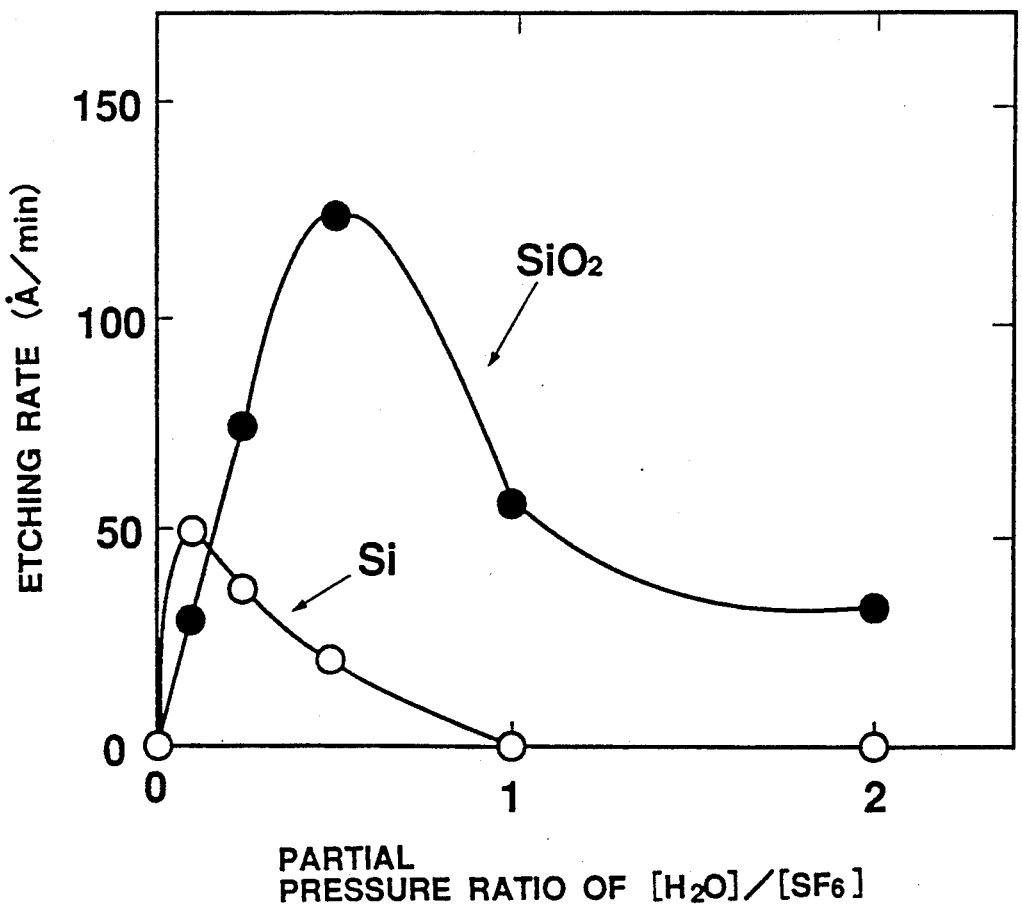
FIG. 20 is a graph showing the relation between the partial pressure ratio of gases and the etching rate.

FIG. 20 is a graph showing the relation between the partial pressure ratio of introduced gases and the etching rate of silicon and silicon dioxide. This silicon means a silicon substrate of the sample 18; and silicon dioxide means a silicon dioxide film formed on said silicon substrate. The gases introduced for etching means a gas mixture of $SF_6$ and $H_2O$, introduced through the gas inlet 13a. The measurement is carried out by changing the mix ratio of these gases. The partial pressures of the gases are changed, while the pressure of vacuum chamber 11 shown in FIG. 1 is maintained at a relatively high value, for example, 3 Torr. The temperature of the sample is about 25° C., and the process is continued for 10 minutes.

From the graph it can be seen that silicon may be etched when the partial pressure ratio $[H_2O]/[SF_6]$ is less than 1; and may not be etched at all when the partial pressure ratio is more than 1. It can also be seen that silicon dioxide may be etched rapidly when the partial pressure ratio is more than 1. If the partial pressure ratio becomes higher, the etching rate of silicon is maintained at about 0Å/min. while the etching rate of silicon dioxide becomes gradually lower. However, the selectivity of silicon dioxide from silicon is maintained even though the partial pressure ratio is so high. Thus, it is possible to etch silicon dioxide with a high selectivity from silicon when the etching is carried out with a partial pressure ratio of more than 1.

FIG. 20 shows a measurement results when the temperature of the sample was kept at room temperature (25° C.). On the other hand, silicon and silicon dioxide cannot be etched at all when the temperature of the sample is kept at about 60° C. X-ray photo-electron spectroscopy analysis of the surface of the silicon dioxide film formed with the partial pressure ratio more than 1 at the room temperature revealed that a layer containing O, S, and F atoms is formed on the silicon dioxide layer. This condensed layer may be removed by heating the sample in a vacuum at about 60° C. After this heating removes the layer, there are still a few F atoms, less than one atom layer, left on the surface of the sample. The F atoms may be removed from the substrate's surface by supplying hydrogen radicals, which are formed by the discharge of hydrogen gas introduced through gas inlet 13a. The F atoms may also be removed by radiating light on the substrate's surface through window 17.

From the result mentioned above, it might be thought that a condensed layer containing O, S, and F atoms is formed on a surface of a substrate; and that the silicon dioxide formed on the substrate reacts with this layer directly so as to etch the silicon dioxide. It might also be thought that etching species can be supplied from that layer so as to etch the silicon dioxide. Said F-containing condensed layer can indeed etch silicon dioxide in this manner; however, it might be thought that $F^-$ ion and $HF_2^-$ ion and $H^+$ ion contribute to the etching in the same manner as the etching of $SiO_2$ by hydrofluoric acid because the condensed layer is a strong acid. The condensed layer does contains S and O atoms, so the etching mechanism as a whole may be thought of as follows.

First, a $SF_4$ gas is produced by discharging $SF_6$ gas; and this $SF_4$ gas reacts with $H_2O$ to produce $SO_2$ gas. The $SO_2$ gas is combined with O atoms which are formed from $H_2O$ by a discharge; and $SO_3$ is produced as a result. This $SO_3$ gas is easily condensed due to its low vapor pressure; so it may be easily deposited on the sample surface. A part of the $SO_3$ deposited on the surface may react with $H_2O$ to produce liquid $H_2SO_4$. On the other hand, HF gas is produced as a result of a reaction between the $H_2O$ and F atoms produced by said discharge, or by the abovementioned reaction between $SF_4 + H_2O$.

HF gas having a large polarity may be dissolved easily in $H_2SO_4$ which also has a large polarity. A part of the dissolved HF is ionized to produce $H^+$, $F^-$, and $HF_2^-$ or the like; and another part of this HF reacts with $H_2SO_4$ to produce $HSO_3F$ and $H_2O$. $HSO_3F$ is another large polarity liquid; and so HF gas is easily dissolved to produce $F^-$ and $HF_2$.

In $SiO_2$, an Si atom has a positive and an O atom has a negative charge respectively, so that $H^+$ ions are attracted to O; and $F^-$ and $HF_2^-$ ions are attracted to si. The Si-O bond in $SiO_2$ is therefore broken to produce $SiF_4$ and $H_2O$. $SiF_4$ and $H_2O$ are volatilized easily: these are removed as gases. On the contrary, Si which does not have a polarity will not react with $H^+$, $F^-$, or the like. Then Si cannot then be etched by the treatment mentioned above.

As a whole, the reaction process can be summarized as follows.

(1) Production of $SO_3$:

$SF_6 \xrightarrow{discharge} SF_4 + 2F$ $H_2O \xrightarrow{discharge} O + OH$ $SF_4 + 2H_2O \longrightarrow SO_2 + 4HF$ $SO_2 + O \longrightarrow SO_3$ (2) Etching of $SiO_2$:

$SO_3 + H_2O \longrightarrow H_2SO_4$ $F + H_2O \longrightarrow HF + OH$ $H_2SO + HF \longrightarrow H_2SO_4 + H^+ + F^- (HF_2^-)$ and $H_2SO_4 + HF \longrightarrow HSO_3F + H_2O$ $HSO_3F + HF \longrightarrow HSO_3F + H^+ + F^- (HF_2^-)$ $SiO_2 + H^+ + F^- (or\ HF_2^-) \longrightarrow SiF_4 + H_2O$ In this way, this invention forms a condensed layer on the surface of a sample, and then etches an oxide film of the sample. It is preferable that a reactor pressure is higher and a sample temperature lower. With a high reactor pressure, gases such as $H_2O$, $SO_3$ and HF more frequently hit the surface of the sample, thereby easily forming $H_2SO_4$ that is containing HF, on the surface of the sample. Furthermore, if the reactor pressure is too low and gases including fluorine or oxygen elements are used, the fluorine or oxygen atoms produced by the electric discharge are transported to the sample to etch or oxidize Si of the sample. This hinders a selective etching of $SiO_2$. If the reactor pressure is high, the fluorine and oxygen atoms frequently collide against other gases before reaching the sample and react with those gases to become stable fluoride and oxide gases. Accordingly, Si of the sample is not etched and oxidized. When the reactor pressure is reduced to 0.2 Torr in the above embodiment, it is impossible to selectively etch $SiO_2$ from Si even with a partial pressure ratio $[H_2O]/[SF_6]$ exceeding 1.

As mentioned above, the oxygen atoms prevent the slective etching of $SiO_2$. To realize the selective etching, it is preferable to employ a discharge tube made of BN with no oxygen, or alumina ($Al_2O_3$). The discharge tube is usually made of quartz ($SiO_2$). The quartz is, however, easily etched by the electric discharge to emit oxygen atoms. If gases contain fluorine elements and $H_2O$ as in the above embodiment, the $H_2O$ reacts with $SiF_4$ produced by etching the quartz to form $SiO_2$, thereby preventing the selective etching of $SiO_2$.

The reason why the sample temperature should be low is explained similarly. The lower the surface temperature, the higher the probability of gas absorption, thereby easily forming a condensed layer. When the condensed layer is thick, an effect of suppressing the reaction of, for example, active fluorine atoms and Si is improved. When the sample temperature is lowered to 5° C. in the above embodiment, it is possible to selectively etch $SiO_2$ from Si with a partial pressure ratio of 0.05 or over.

Figure 21:
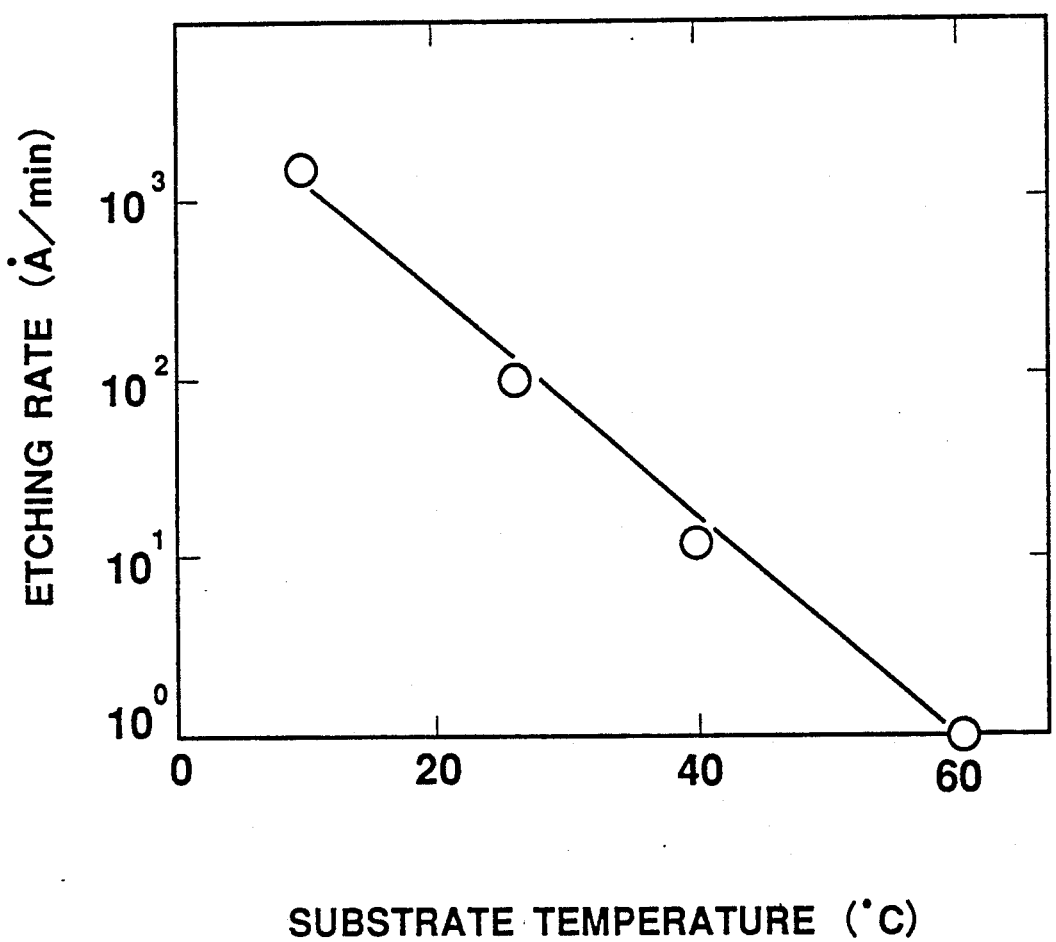
FIG. 21 is a graph showing the relation between the temperature of the sample and the etching rate.

FIG. 21 shows changes in an etching rate of $SiO_2$ with the sample temperature being changed under a partial pressure ratio $[H_2O]/[SF_6]$ of 2. This figure clearly shows that the etching speed becomes higher as the sample temperature becomes lower.

As explained above, a selectivity and speed of the etching are improved with a higher reactor pressure and a lower sample temperature. The effects of the pressure and temperature appear not only on those gasses and samples employed by the embodiment but also on other gases and materials to be explained later.

According to a modification of the invention, a condensed layer is not formed on the surface of a sample. Instead, a material corresponding to the condensed layer is prepared separately and supplied to the sample. Thereafter, the sample is etched.

For example, in the apparatus of FIG. 1, a nozzle having a hole of 0.1 mm in diameter is disposed between the discharging tube 14 and the vacuum chamber 11 to produce a pressure difference between the insides of the discharging tube and vacuum chamber. With this arrangement, a mixture of $SF_6$ and $H_2O$ gases is discharged. The gases coming out of the nozzle are cooled by adiabatic expansion, so that clusters are formed inside the vacuum chamber. By positioning the sample at a location where the clusters are emitted, the clusters are liquidized on the surface of the sample to etch an oxide film of the sample. This technique is capable of etching the oxide film even with a high sample temperature or a low reactor pressure. This eliminates corrosion produced by a condensed layer that is usually formed on the wall of the reactor with a high reactor pressure.

The invention is not limited by the above embodiment.

Although the above embodiment produces $SO_3$ by a reaction of active species generated by electric discharge in a mixture of $SF_6$ and $H_2O$ gases, it is possible to use a rare $SO_3$ gas or oxidize a sulfur gas. Instead of $SF_6$, other gases such as $F_2$, $C_xF_y$, $C_xF_yH_z$, $NF_3$, $BF_3$, $PF_x$, $SF_xCl_y$ and $SF_xO_y$ may be used, and instead of $H_2O$, a mixture of $H_2$ and $O_2$ gases may be used. In addition, gases containing elements H, O, F and S may be employed and reacted to form a condensed layer of HF and $H_2SO_4$ on the surface of a sample to etch an oxide film of the sample.

In the above embodiment, HF is dissolved in $H_2SO_4$. It is possible to dissolve HF in a liquid of inorganic compounds such as $H_2O$, $H_2SO_3$, $HNO_3$, $HNO_2H_2CO_3$, $H_3PO_4$, $H_3BO_3$, $H_3AsO_4$, NCH, $CH_3CN$, $H_2S$ and $POCl_3$ or of organic compounds such as $CH_3OH$, $C_2H_5OH$, $C_3H_8$ and $(C_2H_5)_2O$ to be formed on the surface of a sample. These liquids are formed by activating and reacting gases containing all of component elements.

Instead of dissolving HF in other liquids, HF may be combined with gases such as $BF_3$, $PF_5$ and $SO_3$ to form liquids such as $HBF_4$, $HPF_6$ and $HSO_3F$ on the surface of a sample to etch an oxide film of the sample.

An oxide film to be etched is not limited to $SiO_2$. It is possible to etch, by properly selecting halogen elements, oxides of Al, Cu, W, Mo, Ti, Ta and B, or oxides of their silicides and nitrides. For example, $Al_2O_3$ is etched by dissolving HCl in the above liquids.

In the above embodiment, a mixture of $SF_5$ and $H_2O$ gases is discharged. Instead, the electric discharge may be carried out within only one of the gases. Thereafter, the gases are reacted in a reactor. Gases may be activated not only by the electric discharge but also by optical radiation, heating and a reaction with charged particles and neutral active species. If a gas that spontaneously dissociates to produce active species containing halogen elements is used, an activation of the gas is not necessarily needed. For example, a combination of $XeF_2$, $SO_3$ and $H_2O$ gases demonstrates a similar reaction as that of the above embodiment only by mixing the gases, in etching $SiO_2$.

Embodiment 11

The eleventh embodiment of the invention carries out a similar process as the ninth embodiment with the apparatus of FIG. 1 with a combination of an $SF_6$ gas of 1 Torr and an $H_2O$ gas of 2 Torr. This embodiment removes an oxide silicon film of a contact hole in a short time without damaging a substrate, thereby forming a low resistance contact.

Embodiment 12

The twelfth embodiment of the invention carries out a similar process as the second embodiment with the apparatus of FIG. 3 with a combination of an $SF_6$ gas of 1 Torr and an $H_2O$ gass of 2 Torr. This embodiment forms a good thermal oxide film involving no native oxide film. The similar apparatus and gases are employed to remove a native oxide film. Thereafter, processes such as diffusion, etching, deposition and epitaxial growth are carried out.

Embodiment 13

The thirteenth embodiment of the invention carries out a similar process as the third embodiment with a combination of an $SF_5$ gas of 1 Torr and an $H_2O$ gas of 2 Torr. This embodiment forms a high quality gate oxide film. This embodiment etches an oxide film in a process chamber that is separate from a chamber for thermal oxidization. It is possible to carry out processes such as diffusion, deposition, etching and epitaxial growth.

This invention is not limited to the embodiments 1 to 13 mentioned above. For example, $NF_3$ gas, a pure halogen gas, inter-halogen gas, and a gas which contains a halogen atom and at least one of H, B, C, N, Si, P, As, S, Xe and Kr may be used as the halogen containing gas. Also, a mixture of these gases and a mixture of these gases with oxygen can be used as the halogen-containing gas.

Ammonia, hydrazine, amine, phosphine and arsine may be used as the basic gas. A mixture of these gases, a mixture of $H_2O$ and these gases, or a vapor of an aqueous solution of these gases may also be used as the basic gas. A gas which produces radicals containing halogen element by resolving itself spontaneously means any inter-halogen gas; a gas which is made of halogen and either Xe or Kr atoms such as xenon fluoride gas; and a mixture of these gases. A salt which contains at least one halogen element means any substance which contains a halogen element together with one of ammonia, hydrazine, amine, phosphine or arsine.

Besides silicon wafer, this invention's method permits other substrates to be used: other semiconductors; metals; and nitrides of these materials. A native oxide film or a metal oxide film formed on the substrate can be removed by said method.

For example, a native oxide film and a silicon dioxide film formed by CVD or thermal oxidation, which are formed on a single crystal silicon, polycrystalline silicon or amorphous silicon, can be removed by the method of this invention. Those films containing a halogen, B, As, P, N, C, and H are removed also.

Oxides of Al, Cu, W, Mo, Ti, Ta, and B and alloys of these metals are used as the metal oxides mentioned above. Oxides made from silicides and nitrides of these metals are also used as the metal oxides.

The substrate to be processed according to this invention can be inside the wall of a reaction chamber, a quartz tube, facilities in a vacuum chamber, an inside wall of a gas inlet, and an inside wall of a gas exhausting port, as far as an oxide film is formed on its surface, besides the semiconductor wafer or the like.

If the removal of oxides is carried out while keeping the substrate temperature below 0° C., species of an etching gas such as an $NH_4F$ molecule in the case of $NF_3$ and $NH_3$ gases are easily adsorbed by the surface of the substrate. Therefore, this method is suitable for the removal of oxides formed on a surface of a trench which has a high aspect ratio.

It is preferable to carry out the removal of oxides according to this invention at the room temperature, because the etching rate of the oxides will be decreased when they are heated above the sublimation temperature of thin films such as $NH_4F$, $(NH_4)_2SIF_6$, or the like. For example, it is desirable to carry it out under 100° C. when a combination of a fluorine containing gas and $NH_3$, $NH_4OH$, or a mixture of $NH_3$ and $H_2O$ or $H_2$ is used.

It is readily understood from FIG. 2 that an excellent selective etching can be carried out when the partial pressure ratio of the two gases is more than 1. In this case, the partial pressure ratio of the two gases means the partial pressure of $NF_3$ versus that of $NH_3$, a mixture of $NH_3$ and $H_2O$, or $NH_3$ and $H_2$, and a vapor of an aqueous solution of $NH_4OH$.

The thin film formed during the process of etching oxides can be removed by heating the substrate, or by radiating light or an electron beam on the substrate, or introducing activated neutral particles into a reaction chamber. It is also possible, using a down flow apparatus to remove a small residual halogen from the surface of the substrate by exposure to active species produced by discharge of $H_2$ gas, or by radiating light. Furthermore, the dry etching of an oxide film doesn't have to be done in a vacuum chamber, as above-mentioned embodiments. It is also possible that the etching is done in a chamber at atmospheric pressure or more than atmospheric pressure.

In summary, it is possible by this invention to remove or etch oxides of semiconductors and metals or the like formed on a surface of a substrate by forming a thin film or a condensed layer of materials such as $NH_4F$ and $H_2SO_4/HF$. This removal can be carried out without damaging the underlying substrate, and with high etching selectivity.

Various modifications will become possible for those skilled in the art after receiving the teachings of the present disclosure without departing from the scope thereof.

What is claimed is:

1. A method of etching for removing an oxide material, said method comprising the steps of:
    disposing a substrate carrying said oxide material in a reaction space located in a reactor;
    introducing a reactive gas containing at least both hydrogen and halogen elements into said reaction space, said gas including at least one gaseous compound which has been activated at a separated section from said reactor;

producing a liquid through a chemical reaction of said reactive gas and condensing it on said oxide material;

producing a hydrogen halide through said chemical reaction;

dissolving said hydrogen halide in said liquid; and removing said oxide material by chemical action of said liquid containing said hydrogen halide.

2. The method as claimed in claim 11, wherein said hydrogen halide is HF.

3. The method as claimed in claim 2, wherein said liquid is produced by dissolving said reactive gas in one of $H_2O$, $H_2SO_3$, $HNO_3$, $HNO_2H_2CO_3$, $H_3PO_4$, $H_3BO_3$, $H_3A_sO_4$, HCN, $CH_3CN$, $H_2S$, $POCl_3$, $CH_3OH$, $C_2H_5OH$, $C_3H_8$ and $(CH_2H_5)_2O$.

4. The surface treating method as claimed in claim 1, further comprising the step of cooling the substrate placed in the reaction.

5. The surface treating method as claimed in claim 1, wherein a part of the oxide film of the substrate is removed by charged particle beams, and then said reactive gas is introduced into the reactor, thereby shortening an etching time and forming a high aspect ratio groove.

6. The surface treating method as claimed in claim 1, further comprising at least one of the steps of exposing the etched substrate to the activated gas introduced into the reactor, and irradiating light onto the substrate.

* * * * *